(12) United States Patent
Yamazaki et al.

(10) Patent No.: US 9,608,006 B2
(45) Date of Patent: Mar. 28, 2017

(54) SEMICONDUCTOR DEVICE AND TOUCH PANEL

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 18 days.

(21) Appl. No.: 14/671,207

(22) Filed: Mar. 27, 2015

(65) Prior Publication Data

US 2015/0200213 A1 Jul. 16, 2015

Related U.S. Application Data

(62) Division of application No. 13/888,480, filed on May 7, 2013, now Pat. No. 8,994,891.

(30) Foreign Application Priority Data

May 16, 2012 (JP) .................................. 2012-112752
May 16, 2012 (JP) .................................. 2012-112861

(51) Int. Cl.
*H01L 27/12* (2006.01)
*H01L 27/32* (2006.01)
(Continued)

(52) U.S. Cl.
CPC ........ *H01L 27/1225* (2013.01); *G02F 1/1368* (2013.01); *H01L 27/323* (2013.01);
(Continued)

(58) Field of Classification Search
CPC ......... H01L 27/14601; H01L 27/14609; H01L 27/14692; H01L 27/3227; H01L 27/323;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — Thoi Duong
(74) *Attorney, Agent, or Firm* — Robinson Intellectual Property Law Office; Eric J. Robinson

(57) ABSTRACT

A touch panel whose power consumption can be reduced is provided, and an increase in the manufacturing cost of the touch panel is prevented. A photosensor which includes a light-receiving element including a non-single-crystal semiconductor layer between a pair of electrodes and a transistor including an oxide semiconductor layer in a channel formation region is provided. A touch panel which includes a plurality of pixels and the photosensor adjacent to at least one of the plurality of pixels is provided. Each of the plurality of pixels includes a pair of terminals. One of the pair of terminals is a reflective conductive film. Alternatively, each of the pair of terminals is a light-transmitting conductive film.

12 Claims, 17 Drawing Sheets

(51) Int. Cl.
G02F 1/1368 (2006.01)
G02F 1/1333 (2006.01)

(52) U.S. Cl.
CPC ...... *H01L 27/3227* (2013.01); *G02F 1/13338* (2013.01); *G02F 2201/58* (2013.01)

(58) Field of Classification Search
CPC ......... H01L 27/14625; H01L 27/14643; H01L 27/1461; H01L 27/14612; H01L 27/14616; H01L 27/14636; H01L 27/14665; H01L 27/1222; H01L 31/036; H01L 31/0224; H01L 29/7869; H01L 29/04; A63F 13/211; A63F 13/26; A63F 13/92; A63F 13/2145; A63F 2300/105; A63F 2300/1075; A63F 2009/241; A63F 2009/2419; A63F 2009/2492; A63F 2009/2497; G02F 1/13338; G02F 1/135; G02F 1/1354; G02F 1/136; G02F 1/1362; G02F 1/1368; G02F 2001/13312; G02F 2201/58; G06K 2009/226; G06K 9/2027
USPC ..... 250/208.1, 214.1, 214 R, 208.2, 214 DC, 250/214 P, 336.1; 257/21, 43, 440, 49, 257/53, 59, E27.133, E31.043, E31.097, 257/E31.111, E33.003, 292, 40, 431, 432, 257/448, 466, 72, 84; 340/407.2; 345/156, 173, 175, 204, 87; 382/314, 382/260; 349/116, 12, 24, 25, 42, 43, 50
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,242,449 B1 | 7/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,557,355 B2 | 7/2009 | Mochizuki et al. |
| 7,674,650 B2 | 3/2010 | Akimoto et al. |
| 7,732,819 B2 | 6/2010 | Akimoto et al. |
| 7,858,947 B2 | 12/2010 | Mochizuki et al. |
| 8,519,320 B2 | 8/2013 | Miyazawa et al. |
| 8,674,972 B2 | 3/2014 | Kurokawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0032824 A1 | 2/2009 | Suzumura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0152664 A1 | 6/2009 | Klem et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0175833 A1 | 7/2011 | Kurokawa et al. |
| 2011/0216023 A1 | 9/2011 | Kurokawa et al. |
| 2012/0056861 A1 | 3/2012 | Kurokawa et al. |
| 2013/0011945 A1 | 1/2013 | Suzumura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-326791 A | 12/1995 |
| JP | 08-264794 A | 10/1996 |
| JP | 11-505377 | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2000-172444 A | 6/2000 |
| JP | 2001-109394 A | 4/2001 |
| JP | 2001-292276 A | 10/2001 |
| JP | 2002-076356 A | 3/2002 |
| JP | 2002-189533 A | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-074419 A | 3/2006 |
| JP | 2006-128644 A | 5/2006 |
| JP | 2006-267982 A | 10/2006 |
| JP | 2009-033002 A | 2/2009 |
| JP | 2010-153834 A | 7/2010 |
| JP | 2011-019102 A | 1/2011 |
| JP | 2011-170337 A | 9/2011 |
| JP | 2011-210241 A | 10/2011 |
| JP | 2012-256819 A | 12/2012 |
| TW | 200705010 | 2/2007 |
| TW | 201137448 | 11/2011 |
| WO | WO-2004/114391 | 12/2004 |
| WO | WO-2011/089848 | 7/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates,D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada,T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 102116205) Dated Feb. 7, 2017.

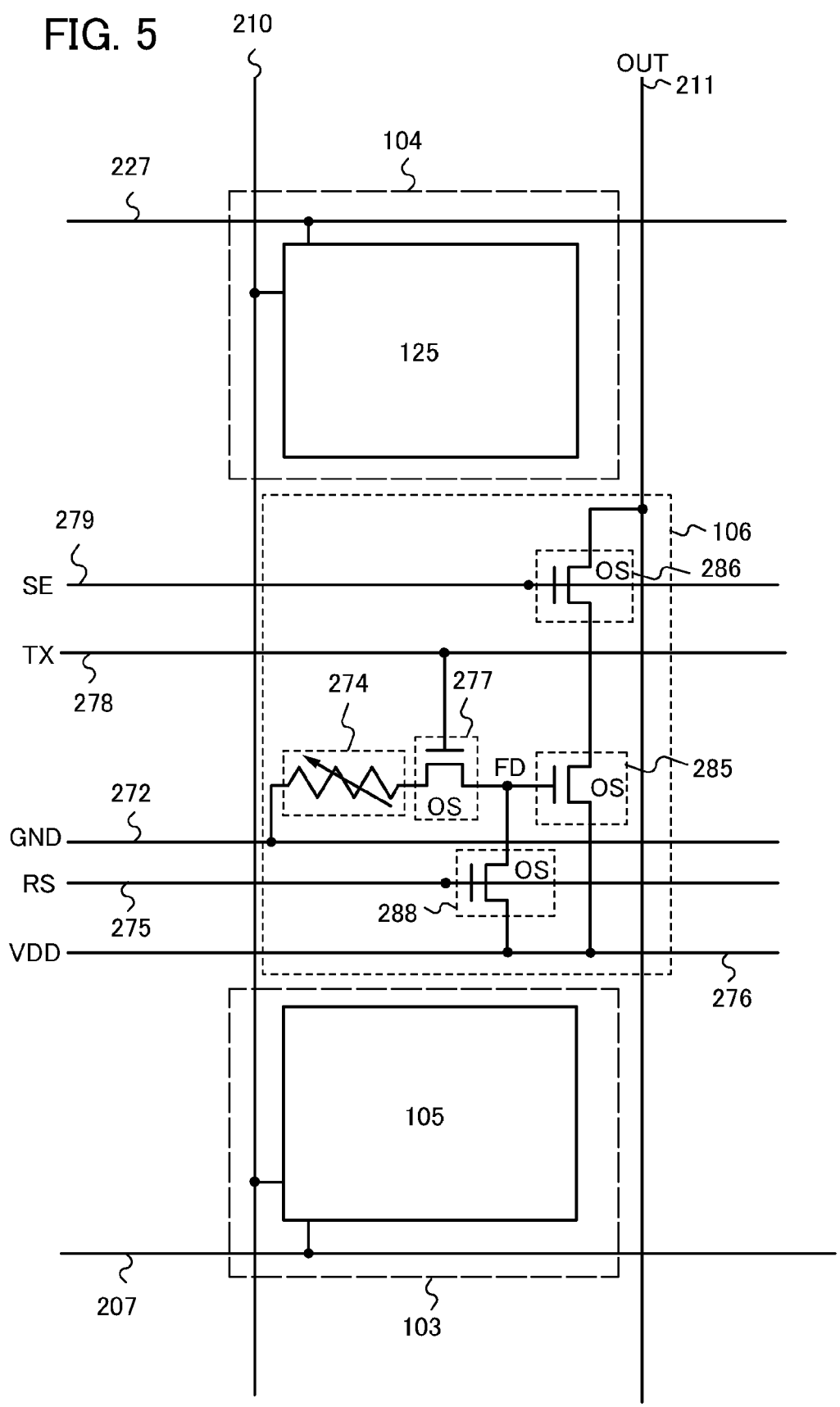

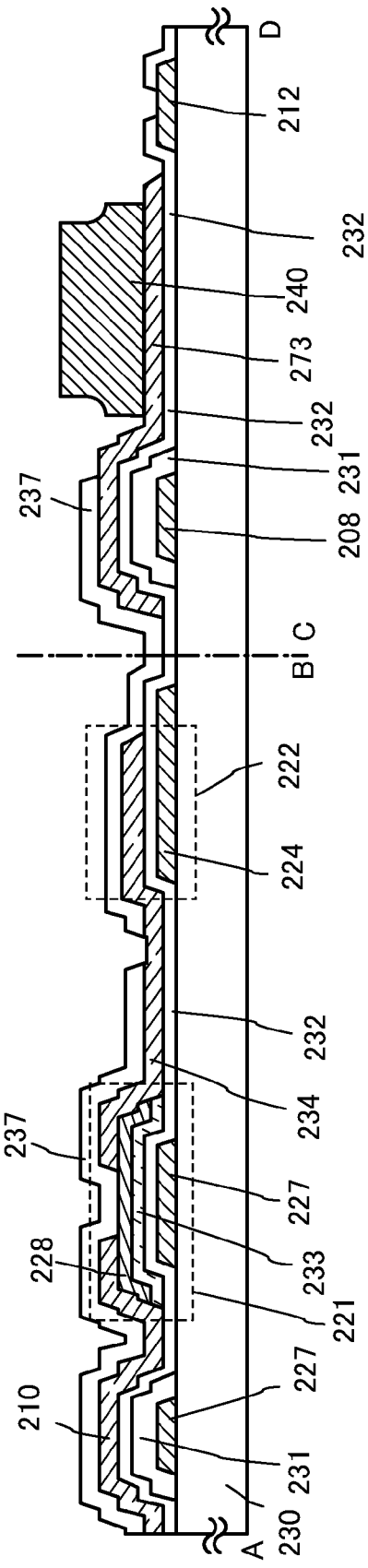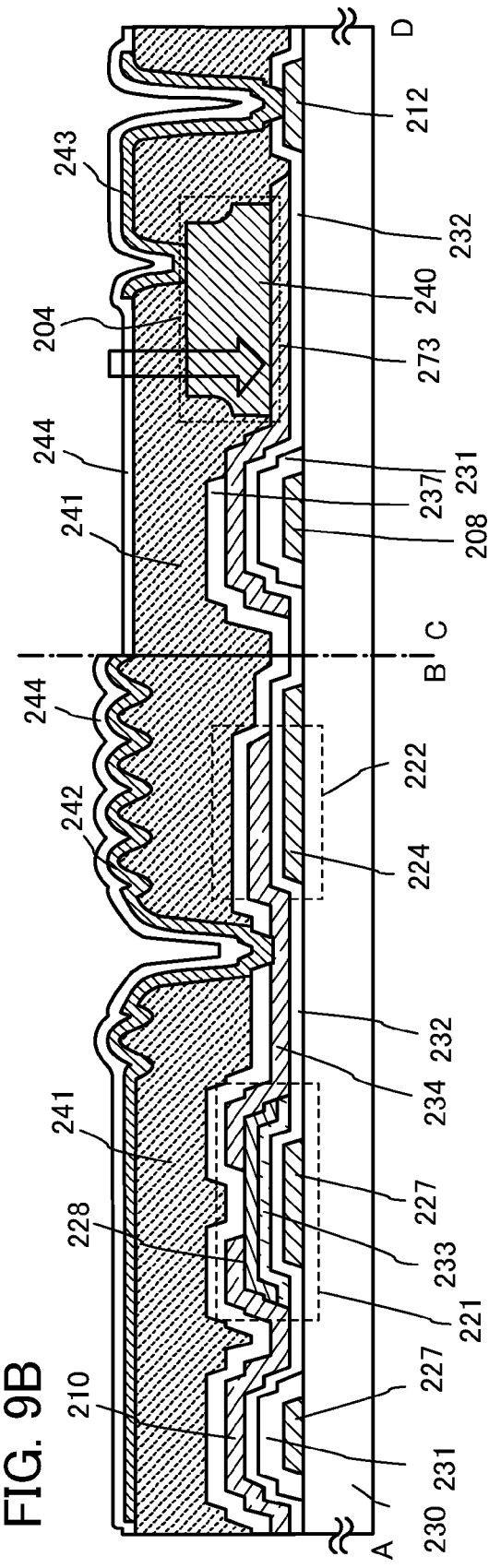

SEMICONDUCTOR DEVICE AND TOUCH PANEL

BACKGROUND OF THE INVENTION

1. Field of the Invention

One embodiment of the disclosed invention relates to a semiconductor device and a touch panel.

2. Description of the Related Art

In recent years, display devices such as e-book readers have been actively developed. In particular, a technique by which images are displayed using a display element with memory properties has been actively developed since it greatly contributes to a reduction in power consumption (Patent Document 1).

In addition, a display device provided with a touch sensor has attracted attention. The display device provided with a touch sensor is called a touch panel, a touch screen, or the like (hereinafter simply referred to as a touch panel). Further, display devices provided with an optical touch sensor are disclosed in Patent Document 2 and Patent Document 3.

A light-emitting element using an organic compound as a light emitter, which has features such as thinness, light-weight, high-speed response, and direct current low voltage driving, has been considered to be applied to a next-generation flat panel display or a next-generation lighting device.

It is said that the light emission mechanism of a light-emitting element is as follows: when a voltage is applied between a pair of electrodes with a layer containing an organic compound provided therebetween, electrons injected from the cathode and holes injected from the anode are recombined in the light emission center of the layer containing an organic compound (also referred to as an EL layer) to form molecular excitons, and energy is released and light is emitted when the molecular excitons return to the ground state. A singlet excited state and a triplet excited state are known as the excited states, and it is thought that light emission can be obtained through either of the excited states.

The layer containing an organic compound has a layered structure typified by a layered structure of a hole-transport layer, a light-emitting layer, and an electron-transport layer. EL materials for forming EL layers are roughly classified into low molecular (monomer) materials and high molecular (polymer) materials. An evaporation apparatus is used for film formation of the low molecular material.

In addition, a light-emitting element including a cathode, an EL layer, and an anode is called an EL element. There are two types of EL elements: a type where an EL layer is formed between two kinds of stripe electrodes that are provided crosswise (simple matrix type); and a type where an EL layer is formed between pixel electrodes that are connected to TFTs and arranged in matrix and counter electrodes (active matrix type). However, when the pixel density is increased, the active matrix type where each pixel (or each dot) is provided with a switch is considered to be advantageous because it can be driven at a lower voltage.

In addition, a display device provided with a touch sensor has attracted attention. The display device provided with a touch sensor is called a touch panel, a touch screen, or the like (hereinafter also referred to simply as a touch panel).

In a conventional touch panel, a pressure-sensitive sensor array or a capacitive sensor array is provided so as to overlap with a display panel; by touching a substrate of the sensor array with a finger or an input pen, the touched position is detected. Accordingly, three or more substrates are used in total because a pair of substrates is used for the display panel and the substrate of the sensor array is disposed so as to overlap with the pair of substrates.

Patent Document 4 discloses a structure in which a touch panel is provided on a display screen of an electroluminescence display device.

In order that the number of substrates overlapping with each other is two, the display device includes an EL element and a photodiode over the same substrate and includes an optical touch sensor; thus, the display device can be light-weight and thin. Patent Document 5 discloses a portable information terminal in which an EL element and a photodiode are provided in one pixel over the same substrate and which includes an optical touch sensor. Patent Document 6 discloses a display device in which a transistor including an oxide semiconductor and an EL element are provided in a pixel and which includes a photodiode.

REFERENCE

Patent Documents

[Patent Document 1] Japanese Published Patent Application No. 2006-267982
[Patent Document 2] Japanese Published Patent Application No. 2001-292276
[Patent Document 3] Japanese Published Patent Application No. 2011-210241
[Patent Document 4] Japanese Published Patent Application No. 2000-172444
[Patent Document 5] Japanese Published Patent Application No. 2002-189533
[Patent Document 6] Japanese Published Patent Application No. 2010-153834

SUMMARY OF THE INVENTION

However, in a portable information terminal including a touch panel, there is a limitation on the battery capacity of a power storage device mounted on the portable information terminal; thus, an electric device, in particular, a portable information terminal needs to be driven with limited battery capacity in some cases.

An object is to provide a touch panel which includes a photosensor advantageous for energy saving and thus whose power consumption can be reduced.

Another object is to provide an electric device which includes a touch panel whose power consumption can be reduced and thus can be driven for a long time even with limited battery capacity.

In Patent Document 3, a photodiode is used as a light-receiving element generating an electric signal when receiving light. The photodiode has a structure in which three layers, a p layer of microcrystalline silicon, an i layer of amorphous silicon, and an n layer of microcrystalline silicon, are stacked.

When such a photodiode, a liquid crystal element, and a transistor including an oxide semiconductor are manufactured over the same substrate, the number of manufacturing steps is increased because the structure is complicated. As a result, a problem arises in that the manufacturing cost is increased.

In view of this, another object is to prevent an increase in manufacturing cost.

In an electric device including a display portion on which an image is displayed, the display portion has a touch-input function with the use of photosensors, keyboard buttons are displayed on at least part of the display portion, and a user inputs data by touching a desired key, so that display corresponding to the desired key is performed on the display portion.

The photosensors detect external light entering the display portion and a shadow which is made on part of the display portion (hereinafter, also referred to as a partial shadow of external light) when a user points a desired position on the display device. An input processing portion processes the position of a photosensor which detects the partial shadow of external light on the display portion, as the coordinate position of touch input. A video signal processing portion outputs data corresponding to the coordinate of touch input, i.e., data of a keyboard, as image data to the display portion.

A transistor which is conventionally used in a photosensor has a problem in that off-state current is large, and thus photocurrent generated in a light-receiving element leaks through the off-state transistor to be lost. According to one embodiment of the present invention, with the use of a transistor including an oxide semiconductor layer as a transistor for a photosensor, the off-state current can be extremely reduced, specifically, the off-state current density per channel width of 1 μm at room temperature can be 10 aA ($1\times10^{-17}$ A/μm) or less, further, 1 aA ($1\times10^{-18}$ A/μm) or less, still further, 10 zA ($1\times10^{-20}$ A/μm) or less. Further, with the use of the transistor including an oxide semiconductor layer for a switching element of a pixel, the holding time of an electric signal such as an image signal can be longer, and intervals of writing time can be set long. Therefore, with the use of the transistor including an oxide semiconductor layer, charge of a pixel electrode electrically connected to the transistor including an oxide semiconductor layer can be held for a long time. Accordingly, a period during which a display element control circuit is in a non-operation state after writing of a still image is set long, whereby power consumption can be further reduced.

In one embodiment of the disclosed invention, one non-single-crystal semiconductor layer is used in a light-receiving element. Accordingly, the number of manufacturing steps is reduced, and manufacturing cost is reduced.

One embodiment of the disclosed invention relates to a semiconductor device including: a light-receiving element including a non-single-crystal semiconductor layer between a pair of electrodes; a power supply line electrically connected to one of the pair of electrodes; a first transistor a gate of which is electrically connected to a signal line, one of a source and a drain of which is electrically connected to the other of the pair of electrodes, and a channel formation region of which is in a first oxide semiconductor layer; a second transistor a gate of which is electrically connected to a reset line, one of a source and a drain of which is electrically connected to the other of the source and the drain of the first transistor, the other of the source and the drain of which is electrically connected to a ground line, and a channel formation region of which is in a second oxide semiconductor layer; a third transistor a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and a fourth transistor a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer.

Another embodiment of the disclosed invention relates to a semiconductor device including: a light-receiving element including a non-single-crystal semiconductor layer between a pair of electrodes; a ground line electrically connected to one of the pair of electrodes; a first transistor a gate of which is electrically connected to a signal line, one of a source and a drain of which is electrically connected to the other of the pair of electrodes, and a channel formation region of which is in a first oxide semiconductor layer; a second transistor a gate of which is electrically connected to a reset line, one of a source and a drain of which is electrically connected to the other of the source and the drain of the first transistor, the other of the source and the drain of which is electrically connected to a power supply line, and a channel formation region of which is in a second oxide semiconductor layer; a third transistor a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and a fourth transistor a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer.

Another embodiment of the disclosed invention relates to a touch panel including: a plurality of pixels; and a photosensor adjacent to at least one of the plurality of pixels. The photosensor includes: a light-receiving element including a non-single-crystal semiconductor layer between a pair of electrodes; a power supply line electrically connected to one of the pair of electrodes; a first transistor a gate of which is electrically connected to a signal line, one of a source and a drain of which is electrically connected to the other of the pair of electrodes, and a channel formation region of which is in a first oxide semiconductor layer; a second transistor a gate of which is electrically connected to a reset line, one of a source and a drain of which is electrically connected to the other of the source and the drain of the first transistor, the other of the source and the drain of which is electrically connected to a ground line, and a channel formation region of which is in a second oxide semiconductor layer; a third transistor a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and a fourth transistor a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer.

Another embodiment of the disclosed invention relates to a touch panel including: a plurality of pixels; and a photosensor adjacent to at least one of the plurality of pixels. The photosensor includes: a light-receiving element including a non-single-crystal semiconductor layer between a pair of electrodes; a ground line electrically connected to one of the pair of electrodes; a first transistor a gate of which is electrically connected to a signal line, one of a source and a drain of which is electrically connected to the other of the pair of electrodes, and a channel formation region of which is in a first oxide semiconductor layer; a second transistor a gate of which is electrically connected to a reset line, one of a source and a drain of which is electrically connected to the other of the source and the drain of the first transistor, the other of the source and the drain of which is electrically connected to a power supply line, and a channel formation region of which is in a second oxide semiconductor layer; a third transistor a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and a fourth transistor a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer.

In one embodiment of the disclosed invention, each of the plurality of pixels includes a fifth transistor, a liquid crystal element, and a storage capacitor.

In one embodiment of the disclosed invention, the liquid crystal element includes a pair of terminals and a liquid crystal layer between the pair of terminals. One of the pair of terminals is a reflective conductive film, and is electrically connected to one of a source and a drain of the fifth transistor. The other of the pair of terminals is a light-transmitting conductive film.

In one embodiment of the disclosed invention, the liquid crystal element includes a pair of terminals and a liquid crystal layer between the pair of terminals. One of the pair of terminals is electrically connected to one of a source and a drain of the fifth transistor. Each of the pair of terminals is a light-transmitting conductive film.

In one embodiment of the disclosed invention, the non-single-crystal semiconductor layer is an i-type amorphous silicon layer.

Another embodiment of the disclosed invention is a method for manufacturing a semiconductor device, including the steps of: forming a first electrode layer through the same step as a source electrode layer and a drain electrode layer of a transistor including an oxide semiconductor; forming an amorphous semiconductor layer over the first electrode layer; forming a second electrode layer over the amorphous semiconductor layer; and forming a connection electrode electrically connected to one of electrodes of an EL element, through the same step as the second electrode layer.

By the above manufacturing method, a display device can be manufactured in such a manner that an EL element and a plurality of transistors each including an oxide semiconductor are manufactured over the same substrate and the amorphous semiconductor layer is formed. Accordingly, an increase in manufacturing cost can be minimized.

A structure obtained by the manufacturing method is another embodiment of the present invention. A semiconductor device having the structure includes: a gate electrode layer over a first substrate having an insulating surface; a gate insulating layer over the gate electrode layer; an oxide semiconductor layer, a source electrode layer, and a drain electrode layer, over the gate insulating layer; a first electrode layer over the gate insulating layer; an amorphous semiconductor layer over the first electrode layer; a first insulating layer covering the amorphous semiconductor layer, the source electrode layer, and the drain electrode layer; a second electrode layer in contact with the amorphous semiconductor layer and over the first insulating layer; a second insulating layer covering the second electrode layer; a third electrode layer electrically connected to the source electrode layer or the drain electrode layer, over the second insulating layer; a light-emitting layer containing an organic compound, over the third electrode layer; a fourth electrode layer over the light-emitting layer containing the organic compound; and a second substrate where a color filter overlapping with the fourth electrode layer is provided.

In the above structure, the color filter between the first substrate and the second substrate, the EL element which includes the light-emitting layer containing an organic compound and overlapping with the color filter, the plurality of transistors each including the oxide semiconductor layer, and a sensor including the amorphous semiconductor layer are provided. As a result, the number of substrates overlapping with each other can be two, and thus the semiconductor device can be lightweight and thin.

In the above structure, the amorphous semiconductor layer is an i layer of amorphous silicon, and is provided over and in contact with the first electrode layer. The second electrode layer is provided over and in contact with the amorphous semiconductor layer. In this case, the amorphous semiconductor layer is made to function as a variable resistance element. The position where the resistance is changed by light irradiation is detected. Here, a stack of the first electrode layer, the amorphous semiconductor layer, and the second electrode layer is not a photodiode.

In order to form a photodiode, a p layer or an n layer may be provided between the first electrode layer and the amorphous semiconductor layer or between the second electrode layer and the amorphous semiconductor layer. However, providing the p layer or the n layer increases the number of manufacturing steps. Further, the p layer contains a p-type impurity element such as boron, and the n layer contains an n-type impurity element such as phosphorus; transistor characteristics might be degraded by diffusion of such an impurity element into the oxide semiconductor layer. In view of this, a sensor element including a variable resistance element is used instead of the photodiode, whereby a reduction in the number of manufacturing steps and an improvement in reliability can be achieved.

In the above structure, the fourth electrode layer overlapping with the light-emitting layer containing an organic compound has a light-transmitting property; light from the light-emitting layer passes through the color filter and the second substrate.

In the above structure, the amorphous semiconductor layer functions as a part of the sensor element, and thus the second substrate, the first insulating layer, and the second insulating layer which overlap with the amorphous semiconductor layer have a light-transmitting property. The amorphous semiconductor layer functions as a part of the sensor element; thus, it is preferable that the amorphous semiconductor layer do not overlap with the color filter.

In the above structure, a partition covering the edge of the third electrode layer may be provided. The partition is provided between the pixels in order to prevent a short circuit between the third electrode layers of the adjacent pixels. The amorphous semiconductor layer functions as a part of the sensor element; thus, it is preferable that the amorphous semiconductor layer do not overlap with the partition.

In the above structure, the number of the sensor elements is preferably smaller than that of the pixels. For example, the ratio of the number of the sensor elements to the number of the pixels is set to 1:4. That is, one sensor element is provided for four pixels. With such a structure, a display panel having a sensor input function while maintaining a display quality can be achieved.

In the above structure, the sensor element is electrically connected to the transistor for driving the sensor element, and is formed over the same substrate as the transistor for driving the EL element.

According to one embodiment of the disclosed invention, a photosensor whose power consumption can be reduced can be provided.

According to one embodiment of the disclosed invention, a touch panel which includes the photosensor and thus whose power consumption can be reduced can be provided.

According to one embodiment of the disclosed invention, an electric device which includes the touch panel and thus can be driven for a long time even with limited battery capacity can be provided.

According to one embodiment of the disclosed invention, one non-single-crystal semiconductor layer is used in a light-receiving element, whereby the number of manufacturing steps and the manufacturing cost of an electric device can be reduced.

BRIEF DESCRIPTION OF THE DRAWINGS

FIG. 5 is an equivalent circuit diagram of pixels, illustrating one embodiment of the present invention.

FIGS. 9A and 9B are cross-sectional views of a pixel, illustrating one embodiment of the present invention.

DETAILED DESCRIPTION OF THE INVENTION

Figure 1A:
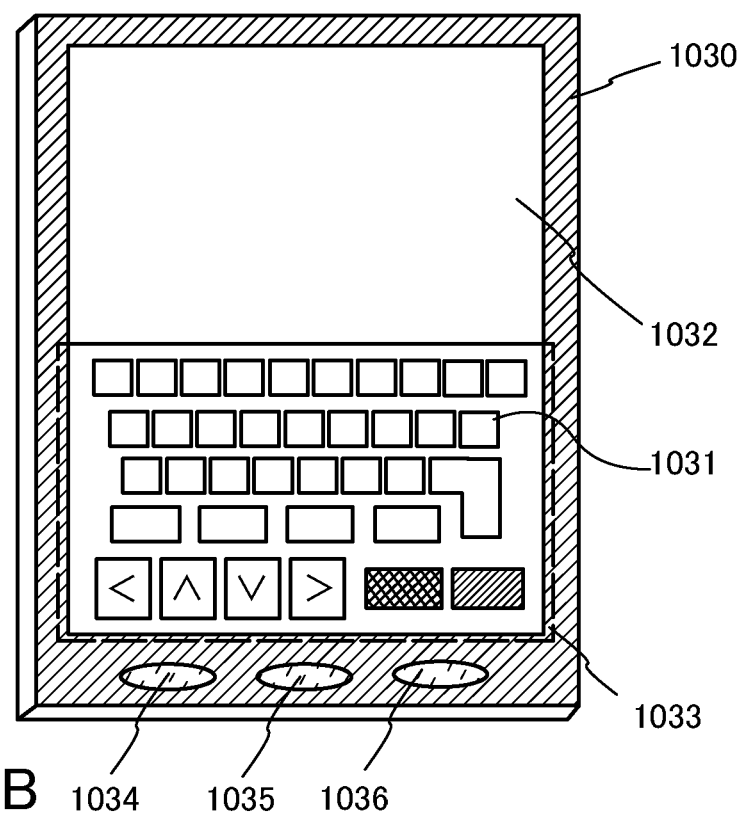
FIGS. 1A and 1B are external views illustrating one embodiment of the present invention.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to the description in the embodiments. Note that, in the drawings hereinafter shown, the same portions or portions having similar functions are denoted by the same reference numerals, and repeated description thereof will be omitted. Further, in some cases, the same hatching patterns are applied to similar parts, and the similar parts are not necessarily designated by reference numerals.

Note that in the invention disclosed in this specification, a semiconductor device refers to an element or a device which functions by utilizing a semiconductor and includes, in its category, an electric apparatus including an electronic circuit, a display device, a light-emitting device, a memory device, and the like and an electric device on which the electric apparatus is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as first, second, and third are used in order to avoid confusion among components, and the terms do not limit the components numerically.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

In this specification and the like, the word concerning the thickness "substantially equal" means "almost equal" as well as "completely equal". For example, "substantially equal" refers to a case where, as compared to the "completely equal" thickness situation, there is a difference in thickness that causes a negligible influence on semiconductor device characteristics (a case where the influence on characteristics is 5% or less), a case where the thickness is slightly reduced by polishing without intention (a case where the polishing amount is less than approximately 5 nm), and the like.

Note that in this specification and the like, the term "over" or "below" does not necessarily mean that a component is placed "directly on" or "directly under" another component. For example, the expression "a gate electrode over a gate insulating film" can mean the case where there is an additional component between the gate insulating film and the gate electrode.

Embodiment 1

In this embodiment, an example of an electric device including a display portion on which an image is displayed will be described with reference to FIGS. 1A and 1B.

<Structure of Electric Device>

A display portion 1032 in an electric device 1030 has an input function for which photosensors are used. A plurality of keyboard buttons 1031 is displayed on a region 1033 in the display portion as illustrated in FIG. 1A. The display portion 1032 indicates the entire display region and includes the region 1033 in the display portion. A user inputs data by touching desired keyboard buttons, whereby a result of the input is displayed on the display portion 1032.

Since the region 1033 in the display portion displays a still image, power consumption can be reduced by making a display element control circuit be in a non-operation state in a period other than a writing period.

An example of the usage of the electric device 1030 will be described. For example, characters are input by the user's fingers successively touching keyboard buttons displayed on the region 1033 in the display portion or detection of an output signal of a photosensor without contact, and text which is displayed as a result of the input is displayed on a region other than the region 1033 in the display portion. After a set period of time in which an output signal of the photosensor is not detected from the time when the user removes his/her fingers from the keyboard of the screen, the keyboard displayed on the region 1033 in the display portion is erased automatically and the input text is displayed also on the region 1033 in the display portion, so that the user can see the input text displayed on all the region of the screen. In the case where input is performed again, the keyboard buttons can be displayed on the region 1033 in the display portion again by touch of the display portion 1032 with the user's finger or detection of an output signal of a photosensor without contact, and input of characters can be performed. Since the display portion 1032 has an input function for which photosensors are used, the position of a finger can be detected even when the region 1033 in the display portion is not touched with the finger. It is needless to say that the position of the finger can be detected also when the region 1033 in the display portion is touched with the finger. That is, the display portion 1032 can be called a touch panel to which data can be input even when the region 1033 in the display portion is not touched with a finger as long as the finger is put close to the region 1033 in the display portion.

Figure 1B:
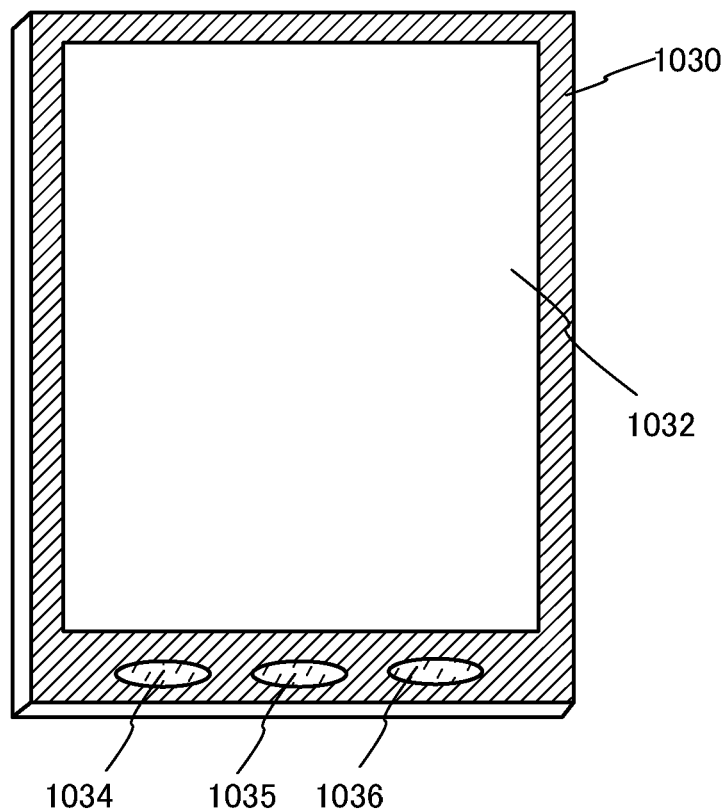

Alternatively, the keyboard can be erased not automatically but by pushing a switch 1034 by the user so that a still image can be displayed on the entire display portion 1032 as illustrated in FIG. 1B. In addition, even when the power is turned off by pushing a power supply switch 1035, the still image can be held for a long time. Further, the keyboard can be displayed by pushing a keyboard display switch 1036 so that touch input can be performed.

In addition, the switch 1034, the power supply switch 1035, and the keyboard display switch 1036 may each be displayed on the display portion 1032 as a switch button. Each operation may be performed by touching the displayed switch button.

Further, the region 1033 in the display portion may display a moving image temporarily or partly as well as a still image. For example, positions at which the keyboard buttons are displayed may be changed temporarily depending on the user's taste, or when input is performed without contact, only display of a corresponding keyboard button may be selectively changed so that the user can see whether the input is performed.

The electric device 1030 includes at least a battery, and preferably includes a memory for storing data (e.g., a flash memory circuit, an SRAM circuit, or a DRAM circuit), a central processing unit (CPU), or a logic circuit. With a CPU or a memory, various kinds of software can be installed and thus, the electric device 1030 can have part or all of the functions of a personal computer.

In addition, when a gradient detector such as a gyroscope or a triaxial acceleration sensor is provided in the electric device 1030, a function used in the electric device 1030, in particular, a function relating to display and input on the display portion can be switched by an arithmetic circuit in response to a signal from the gradient detector. Therefore, unlike in the case of an electric device with an input key which has predetermined kind, size, or arrangement, such as a built-in operation key, convenience for users can be improved.

<Structure of Display Panel>

Figure 2:
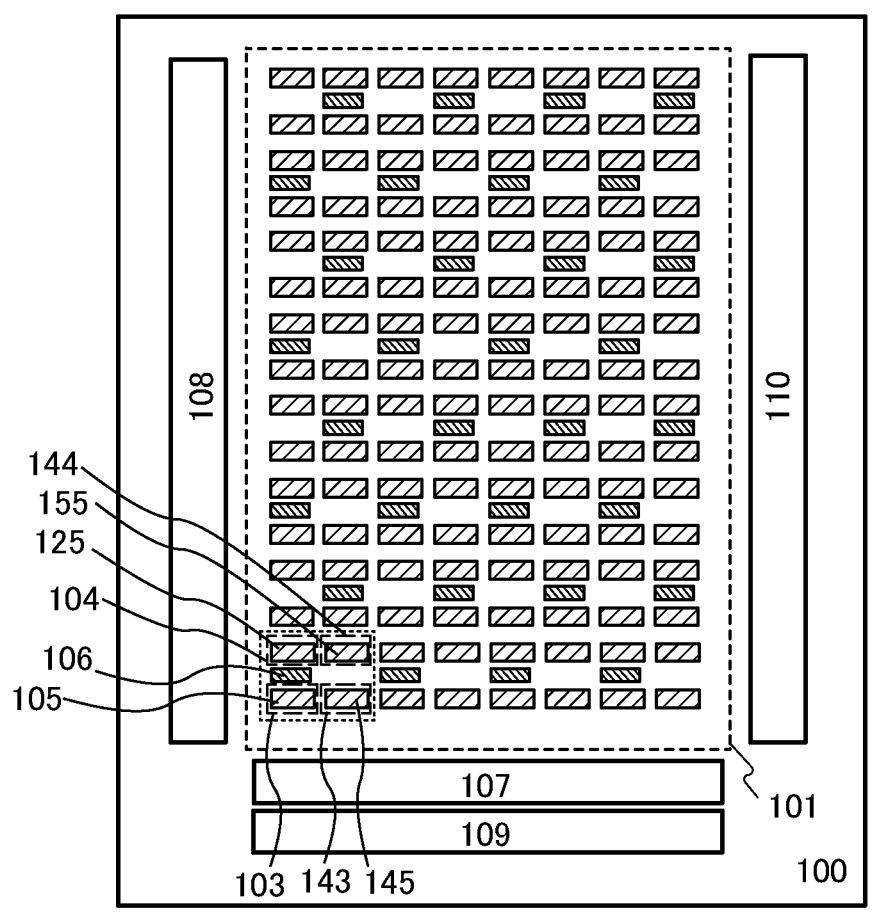
FIG. 2 is a block diagram illustrating one embodiment of the present invention.

Next, an example of a display panel included in the display portion 1032 will be described with reference to FIG. 2. A display panel 100 includes a pixel circuit 101, a display element control circuit, and a photosensor control circuit. The pixel circuit 101 includes a plurality of pixels 103, a plurality of pixels 104, a plurality of pixels 143, a plurality of pixels 144, and a plurality of photosensors 106 which are arranged in a matrix of rows and columns Each of the pixels 103 includes one display element 105; each of the pixels 104, one display element 125; each of the pixels 143, one display element 145; and each of the pixels 144, one display element 155. In this embodiment, one photosensor 106 is disposed between the pixel 103 and the pixel 104. The ratio of the number of photosensors to the number of pixels is not limited to 1:4. The number of pixels adjacent to the photosensor is not particularly limited as long as at least one pixel is adjacent to the photosensor. A structure in which the ratio of the number of photosensors to the number of pixels is 1:1 so that each pixel includes one photosensor, a structure in which the ratio of the number of photosensors to the number of pixels is 1:2, or a structure in which the ratio of the number of photosensors to the number of pixels is 1:3 may be employed.

The display element control circuit is a circuit for controlling the display element, and includes a display element driver circuit 107 from which a signal is input to the display element through a signal line (also referred to as a source signal line) such as a video data signal line; and a display element driver circuit 108 from which a signal is input to the display element through a scan line (also referred to as a gate signal line).

For example, the display element driver circuit 108 on the scan line side has a function of selecting the display elements included in the pixels placed in a particular row. The display element driver circuit 107 on the signal line side has a function of applying a predetermined potential to the display elements included in the pixels placed in the selected row. Note that in the display elements to which the display element driver circuit 108 on the scan line side gives a high potential, transistors are brought into conduction and charges given by the display element driver circuit 107 on the signal line side are supplied to the display elements.

The photosensor 106 includes a transistor and a light-receiving element whose resistance is changed by light irradiation. In this embodiment, as the light-receiving element, a non-single-crystal semiconductor layer provided between a pair of electrodes is used. It is preferable that a non-single-crystal silicon layer, preferably an amorphous silicon layer be used as the non-single-crystal semiconductor layer. In particular, an intrinsic semiconductor, for example, an i-type amorphous silicon layer changes in resistance when receiving light; thus, in a light-receiving element including such an i-type amorphous silicon layer, the value of flowing current is changed. Consequently, the amount of light with which the light-receiving element is irradiated during a predetermined period can be detected.

Note that "intrinsic semiconductor (i-type semiconductor)" in this specification refers to a semiconductor which is intrinsic or substantially intrinsic, and indicates a semiconductor which contains an impurity element imparting one conductivity type (an impurity element imparting p-type conductivity or n-type conductivity) at a concentration of $1 \times 10^{20}/cm^3$ or less and oxygen and nitrogen each at a concentration of $9 \times 10^{19}/cm^3$ or less, and which has photoconductivity 100 times or more the dark conductivity. An intrinsic semiconductor sometimes has weak n-type conductivity when an impurity element for controlling valence electrons is not added intentionally. Further, boron may be added to an intrinsic semiconductor at 1 ppm to 1000 ppm. For example, an impurity element imparting p-type conductivity is added during or after the film formation, in some cases. The impurity element imparting p-type conductivity is typically boron, and an impurity gas such as $B_2H_6$ or $BF_3$ may be mixed into a semiconductor source gas at 1 ppm to 1000 ppm. The concentration of boron may be, for example, $1 \times 10^{14}/cm^3$ to $6 \times 10^{16}/cm^3$.

The photosensor control circuit is a circuit configured to control the photosensors 106 and includes a photosensor reading circuit 109 on the signal line side for a photosensor output signal line 211 and a photosensor driver circuit 110 on the scan line side. The photosensor driver circuit 110 on the scan line side has a function of performing reset operation and selecting operation on the photosensors 106 included in the pixels placed in a particular row, which is described below. Further, the photosensor reading circuit 109 on the signal line side has a function of extracting an output signal of the photosensors 106 included in the pixels in the selected row.

<Structure of Photosensor>

Figure 3:
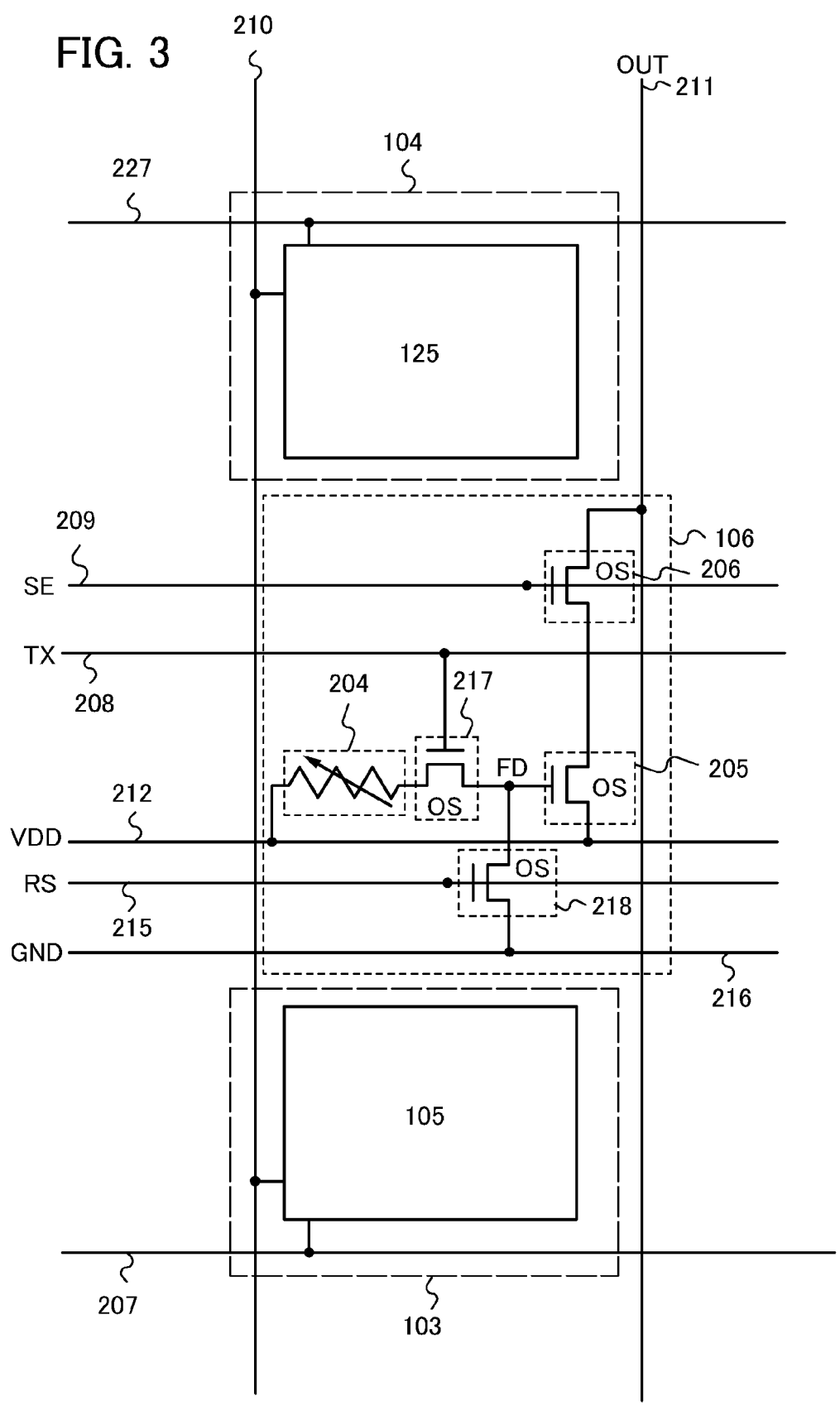
FIG. 3 is an equivalent circuit diagram of a pixel, illustrating one embodiment of the present invention.

A circuit diagram of the pixel 103, the photosensor 106, and the pixel 104 will be described in this embodiment with reference to FIG. 3. The pixel 103 including the display element 105 is electrically connected to the display element driver circuit 108 through a scan line (also referred to as gate signal line) 207 and is electrically connected to the display element driver circuit 107 through a signal line (also referred to as source signal line) 210.

The pixel 104 including the display element 125 is electrically connected to the display element driver circuit 108 through a scan line (also referred to as gate signal line) 227 and is electrically connected to the display element driver circuit 107 through the signal line (also referred to as source signal line) 210.

The photosensor 106 disposed between the pixel 103 and the pixel 104 includes a light-receiving element 204, a transistor 205, a transistor 206, a transistor 217, and a transistor 218. The transistor 205, the transistor 206, the transistor 217, and the transistor 218 are each a transistor including an oxide semiconductor layer in a channel formation region, and thus have an advantage of an extremely small leakage current in an off state (an extremely small off-state current). Accordingly, charge (potential) accumulated in a node in an off state can be held for a long time.

One terminal of the light-receiving element 204 is electrically connected to a power supply line 212 (VDD), and the other terminal thereof is electrically connected to one of a source and a drain of the transistor 217.

The light-receiving element 204 includes one amorphous silicon layer between the pair of electrodes as described above.

A gate of the transistor 217 is electrically connected to a signal line 208 (TX), the one of the source and the drain thereof is electrically connected to the other terminal of the light-receiving element 204, and the other of the source and the drain thereof is electrically connected to one of a source and a drain of the transistor 218 and a gate of the transistor 205. Note that a portion where the other of the source and the drain of the transistor 217, the one of the source and the drain of the transistor 218, and the gate of the transistor 205 are connected to one another is referred to as a node FD.

A gate of the transistor 218 is electrically connected to a reset line 215 (RS), and the one of the source and the drain thereof is electrically connected to the other of the source and the drain of the transistor 217 and the gate of the transistor 205. The other of the source and the drain of the transistor 218 is electrically connected to a ground line 216 (GND).

One of a source and a drain of the transistor 205 is electrically connected to the power supply line 212 (VDD), and the other of the source and the drain thereof is electrically connected to one of a source and a drain of the transistor 206.

A gate of the transistor 206 is electrically connected to a selection line 209 (SE), and the other of the source and the drain thereof is electrically connected to the photosensor output signal line 211 (OUT). The photosensor output signal line 211 (OUT) is electrically connected to the photosensor reading circuit 109.

A high-level power supply potential VDD and a ground potential GND (0 V) as a low-level power supply potential VSS are input to the power supply line 212 (VDD) and the ground line GND, respectively. Note that the ground potential GND (0 V) is used as the low-level power supply potential VSS in this specification; however, any potential lower than the high-level power supply potential VDD can be used as the low-level power supply potential VSS. In this specification, the high-level power supply potential VDD is a high-level potential VH or higher, a low-level potential VL is the ground potential GND or higher, and the high-level potential VH is higher than the low-level potential VL.

<Driving of Photosensor>

Figure 4A:
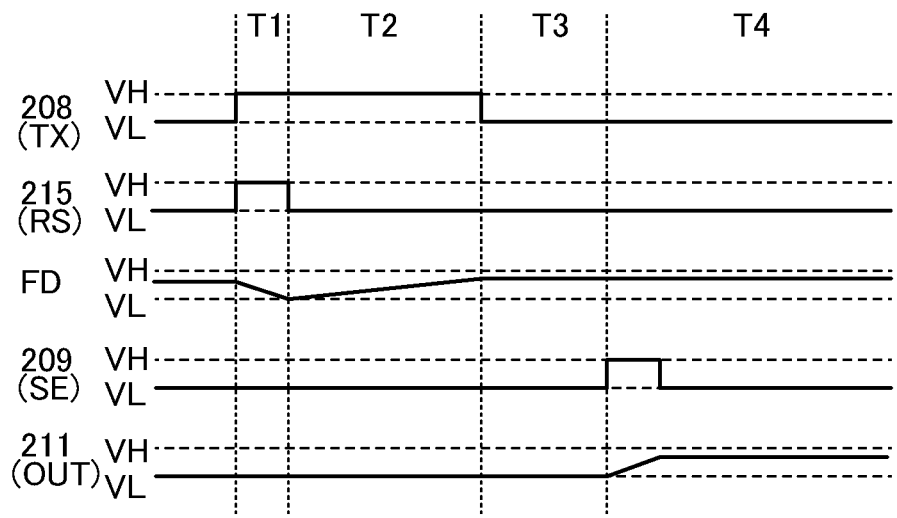
FIGS. 4A and 4B are timing charts showing driving of a photosensor, illustrating one embodiment of the present invention.

FIG. 4A is a timing chart of the photosensor 106.

<<Reset: Period T1>>

In a period T1, the high-level potential VH is input to the reset line 215 (RS) and the signal line 208 (TX). When the high-level potential VH is input to the reset line 215 (RS), the transistor 218 is turned on; thus, the node FD that has been in a floating state is grounded. Accordingly, at the end of the period T1, the potential of the node FD becomes the low-level potential VL. Since the potential of the node FD is the low-level potential VL, the transistor 205 is off at the end of the period T1.

Further, in the period T1, since the high-level potential VH is input to the signal line 208 (TX), the transistor 217 is turned on and electrical continuity is established between the light-receiving element 204 and the node FD.

At the end of the period T1, the potential of the reset line 215 (RS) is changed from the high-level potential VH to the low-level potential VL. Accordingly, the transistor 218 is turned off, and the node FD and the ground line GND are electrically disconnected from each other.

<<Light Exposure: Period T2>>

In a period T2, the resistance of the light-receiving element 204 is changed depending on the amount of light received by the light-receiving element 204; thus, current flows through the transistor 217 to be accumulated in the node FD. When the potential of the node FD changed by charge accumulated in the node FD exceeds the threshold voltage of the transistor 205, the transistor 205 is turned on. The value of current flowing between the source and the drain of the transistor 205 depends on the potential of the node FD.

The larger the amount of light received by the light-receiving element 204 is (the brighter the light received by the light-receiving element 204 is), the larger the amount of current is generated and the higher the potential of the node FD becomes. As long as the potential of the node FD is higher than the threshold voltage of the transistor 205, the transistor 205 is turned on and the value of current flowing between the source and the drain of the transistor 205 is changed depending on the potential of the node FD even when the potential of the node FD does not reach the saturation value (the high-level potential VH). Note that in this embodiment, although the potential of the node FD does not reach the saturation value, the light-receiving element 204 receives light the amount of which is enough to keep the transistor 205 on.

<<Holding: Period T3>>

In a period T3, the potential of the signal line 208 (TX) is changed from the high-level potential VH to the low-level potential VL. Accordingly, the transistor 217 is turned off, and charge in the node FD is held. Consequently, the transistor 205 is kept on during the period T3.

The node FD is surrounded by only an oxide semiconductor layer and an insulating film, which will be described in detail later. For such a reason, the potential of the node FD is not changed by leakage current, and thus charge in the node FD can be held for a long time.

<<Reading: Period T4>>

In a period T4, the high-level potential VH is input to the selection line 209 (SE), so that the transistor 206 is turned on. The power supply line 212 (VDD) outputs a potential to the photosensor output signal line 211 (OUT) depending on the potential of the node FD input to the gate of the transistor 205. Consequently, the output of the photosensor 106 is input to the photosensor reading circuit 109 through the photosensor output signal line 211.

When a transistor including an oxide semiconductor layer is used as the transistor in the photosensor, power consumption of the photosensor can be reduced. With the use of such a photosensor, a touch panel with low power consumption can be provided.

With the use of such a touch panel with low power consumption, an electric device that can be driven with limited power consumption can be provided.

Embodiment 2

In this embodiment, a photosensor having a structure different from that in Embodiment 1 will be described. Note that in this embodiment, portions which are the same as those in Embodiment 1 are denoted by the same reference numerals, and description thereof will not be repeated.

FIG. 5 illustrates a circuit of the photosensor 106 in this embodiment.

The photosensor 106 disposed between the pixel 103 and the pixel 104 includes a light-receiving element 274, a transistor 285, a transistor 286, a transistor 277, and a transistor 288. The transistor 285, the transistor 286, the transistor 277, and the transistor 288 are each a transistor including an oxide semiconductor layer in a channel formation region, and thus have an advantage of an extremely small off-state current. Accordingly, charge (potential) accumulated in a node in an off state can be held for a long time.

One terminal of the light-receiving element 274 is electrically connected to a ground line 272 (GND), and the other terminal thereof is electrically connected to one of a source and a drain of the transistor 277.

A gate of the transistor 277 is electrically connected to a signal line 278 (TX), the one of the source and the drain thereof is electrically connected to the other terminal of the light-receiving element 274, and the other of the source and the drain thereof is electrically connected to one of a source and a drain of the transistor 288 and a gate of the transistor 285. Note that a portion where the other of the source and the drain of the transistor 277, the one of the source and the drain of the transistor 288, and the gate of the transistor 285 are connected to one another is referred to as a node FD.

A gate of the transistor 288 is electrically connected to a reset line 275 (RS), and the one of the source and the drain thereof is electrically connected to the other of the source and the drain of the transistor 277 and the gate of the transistor 285. The other of the source and the drain of the transistor 288 is electrically connected to a power supply line 276 (VDD).

One of a source and a drain of the transistor 285 is electrically connected to the power supply line 276 (VDD), and the other of the source and the drain thereof is electrically connected to one of a source and a drain of the transistor 286.

A gate of the transistor 286 is electrically connected to a selection line 279 (SE), and the other of the source and the drain thereof is electrically connected to the photosensor output signal line 211 (OUT). The photosensor output signal line 211 (OUT) is electrically connected to the photosensor reading circuit 109.

<Driving of Photosensor>

Figure 4B:
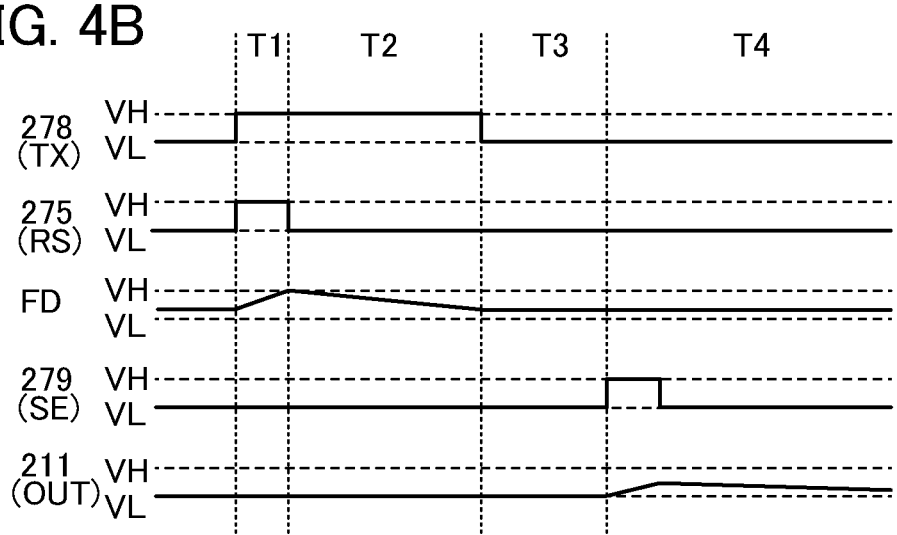

FIG. 4B is a timing chart of the photosensor 106.

<<Reset: Period T1>>

In a period T1, a high-level potential VH is input to the reset line 275 (RS) and the signal line 278 (TX). When the high-level potential VH is input to the reset line 275 (RS), the transistor 288 is turned on; thus, the node FD that has been in a floating state is electrically connected to the power supply line 276 (VDD). Accordingly, at the end of the period T1, the potential of the node FD becomes the high-level potential VH. Since the potential of the node FD is the high-level potential VH, the transistor 285 is on at the end of the period T1.

Further, in the period T1, since the high-level potential VH is input to the signal line 278 (TX), the transistor 277 is turned on and electrical continuity is established between the light-receiving element 274 and the node FD.

At the end of the period T1, the potential of the reset line 275 (RS) is changed from the high-level potential VH to a low-level potential VL. Accordingly, the transistor 288 is turned off, and the node FD and the ground line GND are electrically disconnected from each other.

<<Light Exposure: Period T2>>

In a period T2, the resistance of the light-receiving element 274 is changed depending on the amount of light received by the light-receiving element 274; thus, current flows. The node FD has the high-level potential VH at the beginning of the period T2. The potential of the node FD is decreased as current flows by the light-emitting element 274. The larger the amount of light received by the light-receiving element 274 is (the brighter the light received by the light-receiving element 274 is), the larger the amount of current is generated and the lower the potential of the node FD becomes. Note that in this embodiment, although the potential of the node FD is decreased, the light-receiving element 274 is irradiated with light the amount of which is enough to keep the transistor 285 on.

<<Holding: Period T3>>

In a period T3, the potential of the signal line 278 (TX) is changed from the high-level potential VH to the low-level potential VL. Accordingly, the transistor 277 is turned off, and charge in the node FD is held. Consequently, the transistor 285 is kept on during the period T3.

The node FD is surrounded by only an oxide semiconductor layer and an insulating film, which will be described in detail later. For such a reason, the potential of the node FD is not changed by leakage current, and thus charge in the node FD can be held for a long time. In the case where the node FD is surrounded by an insulating film and a semiconductor layer other than an oxide semiconductor layer, charge accumulated in the node FD flows through the semiconductor layer other than an oxide semiconductor layer. Consequently, the potential of the node FD is changed. For such a reason, the node FD is preferably surrounded by only an insulating film and an oxide semiconductor layer because charge can be held for a long time.

<<Reading: Period T4>>

In a period T4, the high-level potential VH is input to the selection line 279 (SE), so that the transistor 286 is turned on. The power supply line 276 (VDD) outputs a potential to the photosensor output signal line 211 (OUT) depending on the potential of the node FD input to the gate of the transistor 285. Consequently, the output of the photosensor 106 is input to the photosensor reading circuit 109 through the photosensor output signal line 211.

When a transistor including an oxide semiconductor layer is used as the transistor in the photosensor, power consumption of the photosensor can be reduced. With the use of such a photosensor, a touch panel with low power consumption can be provided.

An electric device which includes a touch panel whose power consumption can be reduced and thus can be driven even with limited battery capacity can be provided.

Embodiment 3

In this embodiment, an example where liquid crystal elements are used as the display elements in Embodiments 1 and 2 will be described. Note that in this embodiment, portions which are the same as those in Embodiments 1 and 2 are denoted by the same reference numerals, and description thereof will not be repeated.

Figure 6:
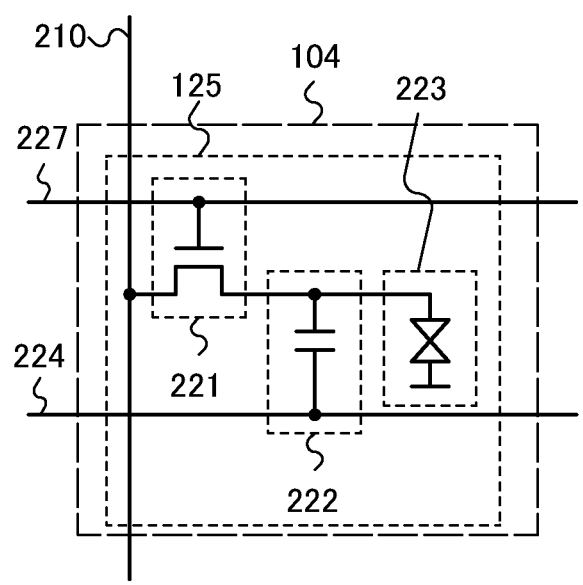
FIG. 6 is an equivalent circuit diagram of a liquid crystal element, illustrating one embodiment of the present invention.

The display element 125 in the pixel 104 includes a transistor 221, a storage capacitor 222, and a liquid crystal element 223 (see FIG. 6).

The transistor 221 has a function of controlling injection or discharge of charge to/from the storage capacitor 222. A gate of the transistor 221 is electrically connected to the display element driver circuit 108 through the scan line (gate signal line) 227. One of a source and a drain of the transistor 221 is electrically connected to the display element driver circuit 107 through the signal line (source signal line) 210. The other of the source and the drain of the transistor 221 is electrically connected to one terminal of the storage capacitor 222 and one terminal of the liquid crystal element 223.

The storage capacitor 222 has a function of holding a charge corresponding to a voltage applied to the liquid crystal element 223. The contrast (grayscale) of light passing through the liquid crystal element 223 is made by utilizing the change in the polarization direction due to voltage application to the liquid crystal element 223, whereby image display is achieved. External light (sunlight or illumination light) which enters from a surface side of a display device is used as the light passing through the liquid crystal element 223.

The one terminal of the storage capacitor is electrically connected to the other of the source and the drain of the transistor 221 and the one terminal of the liquid crystal element 223. The other terminal of the storage capacitor 222 is electrically connected to a capacitor wiring 224 and held at a fixed potential.

The liquid crystal element 223 includes the pair of terminals and a liquid crystal layer between the pair of terminals. The one terminal of the liquid crystal element 223 is electrically connected to the other of the source and the drain of the transistor 221 and the one terminal of the storage capacitor 222. The other terminal of the liquid crystal element 223 is held at a fixed potential.

There is no particular limitation on the liquid crystal layer of the liquid crystal element 223, and a known liquid crystal material (typically, a nematic liquid crystal material or a cholesteric liquid crystal material) may be used. For example, polymer dispersed liquid crystal (PDLC) or polymer network liquid crystal (PNLC) may be used for the liquid crystal layer so that a white image (a bright image) is displayed using scattered light by liquid crystal. When PDLC or PNLC is used for the liquid crystal layer, a polarizing plate is not needed and display close to paper can be achieved. Thus, an eye-friendly liquid crystal display device which causes less eye strain can be manufactured.

Figure 7:
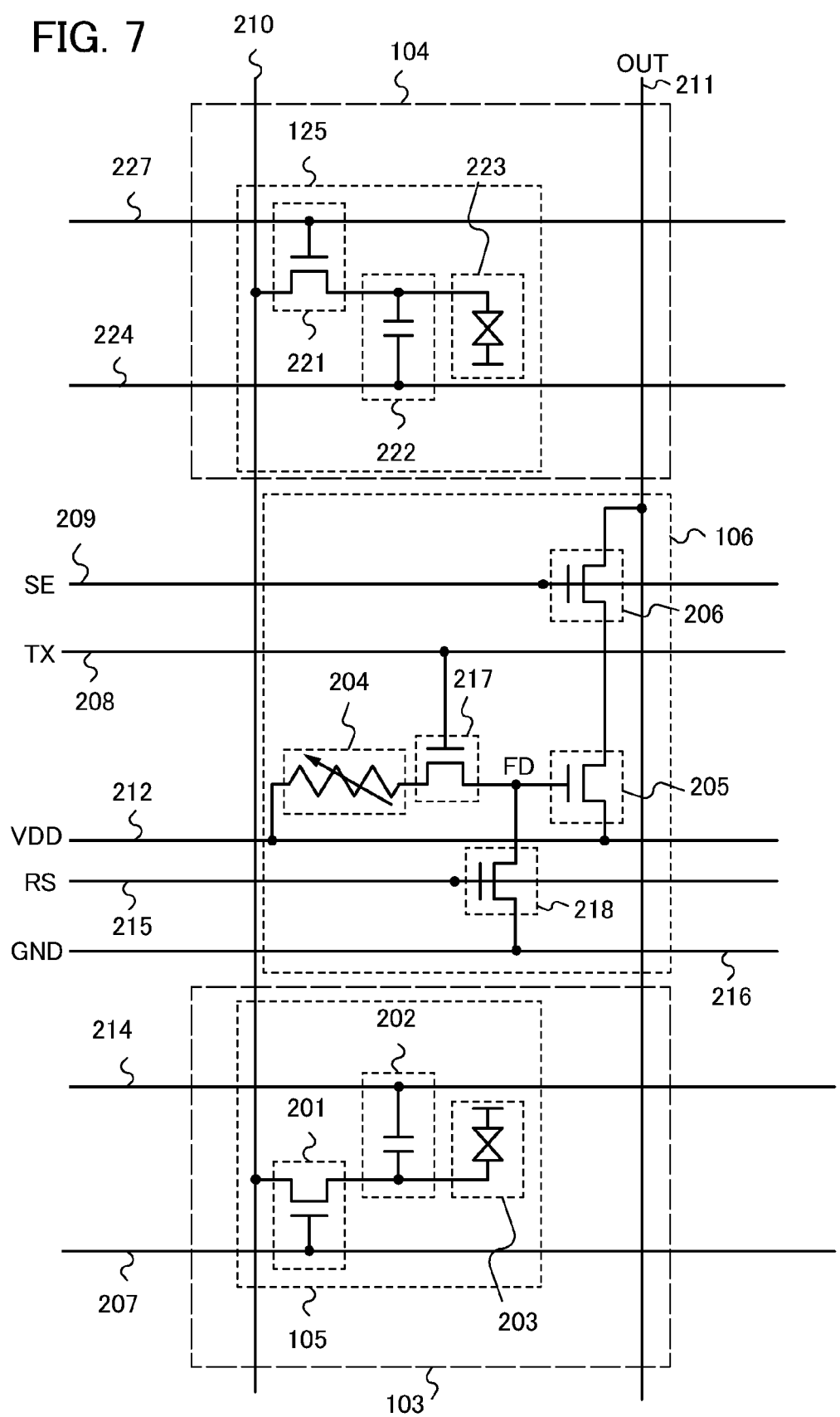
FIG. 7 is an equivalent circuit diagram of pixels, illustrating one embodiment of the present invention.

The display element 105 in the pixel 103 includes a transistor 201, a storage capacitor 202, and a liquid crystal element 203, and has a structure similar to that of the display element 125. For the transistor 201, the storage capacitor 202, and the liquid crystal element 203 of the display element 105, the descriptions of the transistor 221, the storage capacitor 222, and the liquid crystal element 223 of the display element 125 can be referred to, respectively. A circuit configuration in which the display element 125 and the display element 105 of this embodiment are applied to the configuration of FIG. 3 in Embodiment 1 is illustrated in FIG. 7.

Figure 8:
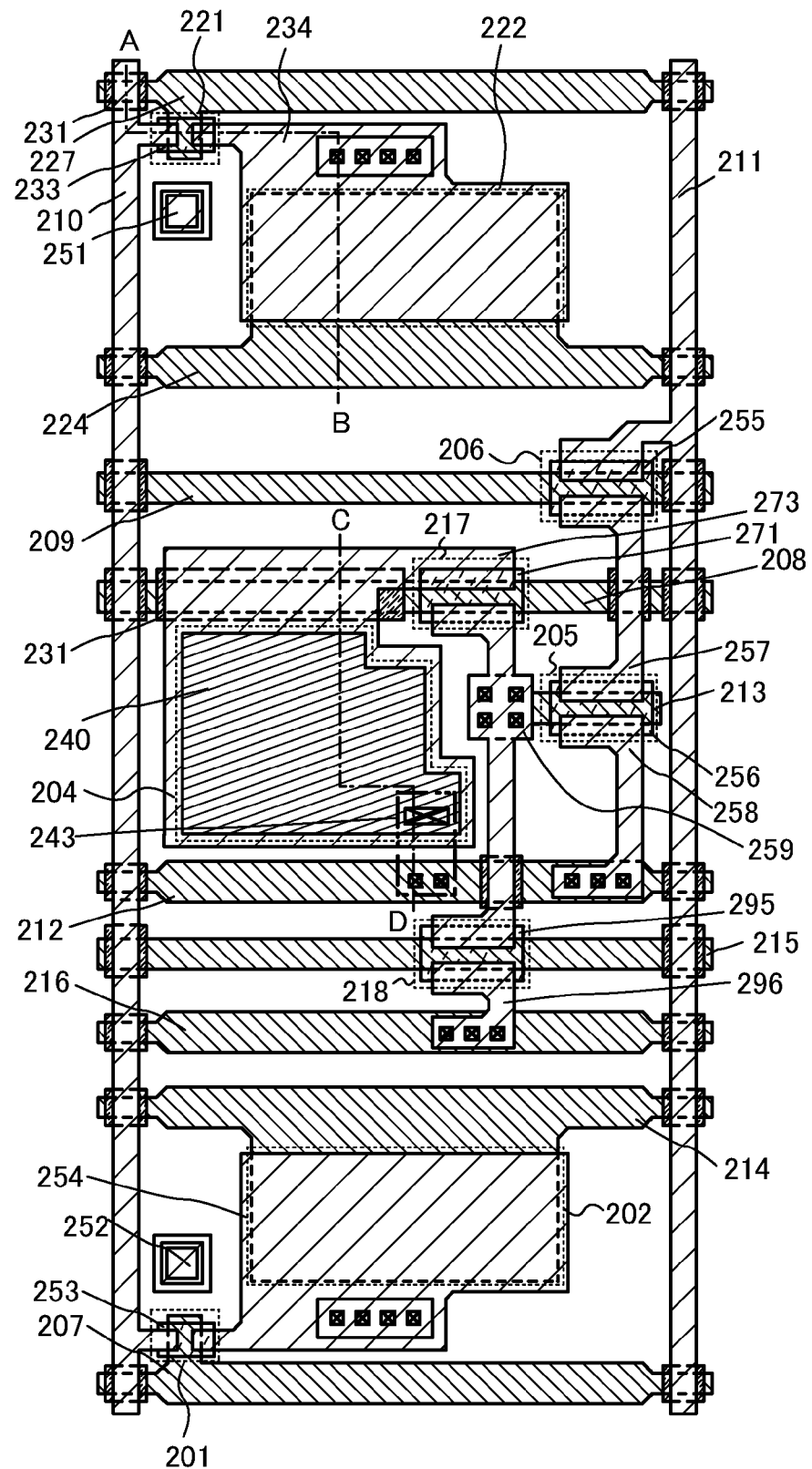
FIG. 8 is a plan view of pixels, illustrating one embodiment of the present invention.

FIG. 8 is a plan view of pixels of this embodiment. FIGS. 9A and 9B illustrate cross sections taken along dashed-dotted lines A-B and C-D in FIG. 8. Hereinafter, a structure of the liquid crystal element of this embodiment and a method for manufacturing the liquid crystal element will be described with reference to FIG. 8 and FIGS. 9A and 9B.

First, a conductive film is formed over a substrate 230, and the scan line 227, the capacitor wiring 224, the selection line 209, the signal line 208, an electrode layer 213, the power supply line 212, the reset line 215, the ground line 216, a capacitor wiring 214, and the scan line 207 are formed using the conductive film. In this embodiment, a glass substrate is used as the substrate 230. The process temperature of a transistor including an oxide semiconductor layer can be as low as 400° C. or lower; thus, a plastic substrate may be used as the substrate 230 as well as a glass substrate.

An insulating film serving as a base film may be provided between the substrate 230 and the conductive film. The base film has a function of preventing diffusion of impurity elements from the substrate 230, and can be formed with a single-layer structure or a layered structure using one or more of a silicon nitride film, a silicon oxide film, a silicon nitride oxide film, and a silicon oxynitride film.

The conductive film can be formed with a single-layer structure or a layered structure including a metal material such as molybdenum, titanium, tantalum, tungsten, aluminum, copper, neodymium, or scandium, or an alloy material which contains any of these metal materials as its main component.

Then, an insulating layer is formed so as to cover these wirings, and selective etching is performed such that an insulating layer 231 remains only in a portion intersecting a wiring which is to be formed later. In this embodiment, a silicon oxynitride film with a thickness of 600 nm is used as the insulating layer 231.

Next, a gate insulating layer 232 and an oxide semiconductor film are formed.

The gate insulating layer 232 may be formed using a silicon film containing nitrogen. The relative permittivity of the silicon film containing nitrogen is higher than that of a silicon oxide film, and thus the silicon film containing nitrogen needs a larger thickness than the silicon oxide film in order that the silicon film containing nitrogen and the silicon oxide film have similar electrostatic capacitances; accordingly, the physical thickness of the gate insulating layer can be made large. From the above, the electrostatic breakdown of the semiconductor device can be suppressed by preventing a reduction in the withstand voltage of the transistor and improving the withstand voltage.

The thickness of the gate insulating layer 232 is made larger than at least that of an oxide insulating layer to be described later; the thickness of the gate insulating layer 232 is preferably greater than or equal to 325 nm and less than or equal to 550 nm, more preferably greater than or equal to 355 nm and less than or equal to 550 nm.

As the silicon film containing nitrogen, for example, a silicon nitride film, a silicon nitride oxide film, or a silicon oxynitride film can be used; in particular, a silicon nitride film is preferably used because a film containing a larger amount of nitrogen has a higher relative permittivity. Silicon oxide has an energy gap of 8 eV, whereas silicon nitride has a small energy gap of 5.5 eV and has low specific resistivity accordingly. For such a reason, the use of a silicon nitride film enables the resistance to ESD to be improved. Further, an $N_2O$ gas, which is a greenhouse effect gas used when a silicon film containing oxygen and nitrogen such as a silicon nitride oxide film is formed by a CVD method, is not needed in the case where a silicon nitride film is formed by a CVD method. Note that in this specification, a silicon oxynitride film contains more oxygen than nitrogen, and a silicon nitride oxide film contains more nitrogen than oxygen.

As the oxide semiconductor film, an oxide thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. Further, $SiO_2$ may be contained in the above oxide thin film.

As a target for forming the oxide thin film by a sputtering method, for example, an oxide target having a composition of $In_2O_3:Ga_2O_3:ZnO=1:1:1$ [molar ratio] is used to form an In—Ga—Zn—O film. Without limitation to the material and the component of this target, for example, an oxide target having a composition of $In_2O_3:Ga_2O_3:ZnO=1:1:2$ [molar ratio] may be used. Note that here, for example, an In—Ga—Zn—O film refers to an oxide film containing indium (In), gallium (Ga), and zinc (Zn), and there is no particular limitation on the stoichiometric proportion.

Note that an oxide insulating layer may be provided between the gate insulating layer 232 and the oxide semiconductor film.

The oxide insulating layer includes one or more metal elements selected from constituent elements of the oxide semiconductor film. By forming the oxide insulating layer using such a material, the interface with the oxide semiconductor film can be stabilized, and thus charge can be prevented from being trapped at the interface. Accordingly, a highly reliable transistor in which degradation, in particular photodegradation, is prevented can be provided.

Specifically, the oxide insulating layer is preferably formed using, for example, a gallium oxide film (also referred to as $GaO_x$ (x is not necessarily a natural number and includes a non-natural number)), a gallium zinc oxide film (also referred to as $Ga_2Zn_xO_y$ (x=1 to 5)), a $Ga_2O_3$ ($Gd_2O_3$) film, an insulating In—Ga—Zn-based oxide film in which the gallium content is high and the indium content is low, or the like.

The constituent elements of the oxide insulating layer and the oxide semiconductor film may be the same, but the compositions thereof may be different from each other. For example, in the case where the oxide semiconductor film is formed using an In—Ga—Zn-based oxide semiconductor layer, the energy gap can be controlled by adjusting the proportions of indium (In) and gallium (Ga); thus, the oxide semiconductor film having an atomic ratio of In:Ga:Zn=1:1:1 or In:Ga:Zn=3:1:2 and the oxide insulating layer having an atomic ratio of In:Ga:Zn=1:3:2 may be used. The oxide insulating layer and the oxide semiconductor film can be formed by a sputtering method; in the case where a sputtering target contains indium, generation of particles during deposition can be reduced. For such a reason, an oxide insulating layer containing indium and an oxide semiconductor film containing indium are preferably used.

Over the oxide semiconductor film (referred to as a first oxide semiconductor film), a second oxide semiconductor film may be further formed, so that the oxide semiconductor film can have a layered structure. In the example of FIG. 9A, an oxide semiconductor layer 233 is formed from the first oxide semiconductor film and an oxide semiconductor layer 228 is formed from the second oxide semiconductor film.

It is preferable that the constituent elements of the first oxide semiconductor film and the second oxide semiconductor film be the same and the compositions thereof be different from each other. In the case where oxide semiconductor films containing indium and gallium are formed as the first oxide semiconductor film and the second oxide semiconductor film, in the first oxide semiconductor film which is closer to a gate electrode (on a channel side), the In content is preferably higher than the Ga content. In the second oxide semiconductor film which is farther from the gate electrode (on a back channel side), the In content is preferably lower than or equal to the Ga content.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, the formation energy of oxygen vacancy is larger and thus oxygen vacancy is less likely to occur in Ga than in In; thus, the oxide having a composition of In≤Ga has more stable characteristics than the oxide having a composition of In>Ga.

An oxide semiconductor having a composition of In>Ga is used on the channel side and an oxide semiconductor having a composition of In≤Ga is used on the back channel side, whereby the mobility and reliability of the transistor can be further improved. For example, the first oxide semiconductor film may have an atomic ratio of In:Ga:Zn=3:1:2, and the second oxide semiconductor film may have an atomic ratio of In:Ga:Zn=1:1:1.

It is preferable that the constituent elements of the oxide insulating layer in contact with the first oxide semiconductor film be the same as those of the first oxide semiconductor film, and the compositions of the oxide insulating layer and the first oxide semiconductor film be different from each other because the interface therebetween can be stabilized. The same applies to the case where the oxide insulating layer is in contact with the second oxide semiconductor film.

Further, oxide semiconductors having different crystallinities may be used for the first oxide semiconductor film and the second oxide semiconductor film. That is, the first oxide semiconductor film and the second oxide semiconductor film may be formed using a combination of any of a single crystal oxide semiconductor, a polycrystalline oxide semiconductor, a microcrystalline oxide semiconductor, an amorphous oxide semiconductor, and a CAAC—OS film as appropriate. When an oxide semiconductor having low crystallinity is used for at least one of the first oxide semiconductor film and the second oxide semiconductor film, internal stress or external stress of the layered structure of the first oxide semiconductor film and the second oxide semiconductor film is relieved, variation in characteristics of a transistor is reduced, and the reliability of the transistor can be further improved.

On the other hand, an amorphous oxide semiconductor is likely to absorb an impurity which serves as a donor, such as hydrogen, and to generate an oxygen vacancy, and thus easily becomes n-type. Thus, the first oxide semiconductor film on the channel side is preferably a crystalline oxide semiconductor film such as a CAAC—OS film.

When an amorphous oxide semiconductor is used for the second oxide semiconductor film on the back channel side, oxygen vacancy is generated in the second oxide semiconductor film due to etching treatment for forming a source electrode layer and a drain electrode layer in a later step so that the second oxide semiconductor film is likely to be n-type. For such a reason, an oxide semiconductor having crystallinity is preferably used for the second oxide semiconductor film.

In this embodiment, a silicon oxynitride film with a thickness of 100 nm is used as the gate insulating layer 232, and an In—Ga—Zn—O film with a thickness of 30 nm is used as the oxide semiconductor film.

The oxide semiconductor layer 233 overlapping with the scan line 227 with the gate insulating layer 232 interposed therebetween, an oxide semiconductor layer 255 overlapping with the selection line 209 with the gate insulating layer 232 interposed therebetween, an oxide semiconductor layer 271 overlapping with the signal line 208 with the gate insulating layer 232 interposed therebetween, an oxide semiconductor layer 256 overlapping with the electrode layer 213 with the gate insulating layer 232 interposed therebetween, an oxide semiconductor layer 295 overlapping with the reset line 215 with the gate insulating layer 232 interposed therebetween, and an oxide semiconductor layer 253 overlapping with the scan line 207 with the gate insulating layer 232 interposed therebetween are formed from the oxide semiconductor film (the first oxide semiconductor film).

In FIG. 8, only the oxide semiconductor layers 233, 255, 271, 256, 295, and 253 formed from the first oxide semiconductor film are illustrated; however, as described above, each of the oxide semiconductor layers may have a layered structure in which the second oxide semiconductor film is formed over the first oxide semiconductor film. Further, an oxide insulating layer may be provided in contact with each of the oxide semiconductor layers.

Next, the oxide semiconductor layers are subjected to first heat treatment. The oxide semiconductor layers can be dehydrated or dehydrogenated by this first heat treatment. The temperature of the first heat treatment is higher than or equal to 350° C. and lower than the strain point of the substrate. In this embodiment, heat treatment is performed using a rapid thermal annealing (RTA) apparatus at 650° C. for 6 minutes under a nitrogen atmosphere; the substrate is introduced to an electric furnace that is one kind of heat treatment apparatus without exposure to the air; and the oxide semiconductor layers are subjected to heat treatment at 450° C. for one hour under a nitrogen atmosphere. Thus, the oxide semiconductor layers can be obtained without entry of water or hydrogen into the oxide semiconductor layers.

Next, a conductive film is formed over the gate insulating layer 232 and the oxide semiconductor layers. As the conductive film, for example, a metal film containing an element selected from aluminum (Al), chromium (Cr), copper (Cu), tantalum (Ta), titanium (Ti), molybdenum (Mo), and tungsten (W) as a component, an alloy film containing a nitride of any of these elements as a component, an alloy film in which any of these elements are combined, or the like can be used. In this embodiment, the conductive film has a three-layer structure of a titanium film with a thickness of 100 nm, an aluminum film with a thickness of 400 nm, and a titanium film with a thickness of 100 nm.

Then, a resist mask is formed over the conductive film, and selective etching is performed, whereby the signal line 210, the photosensor output signal line 211, and electrode layers 234, 257, 258, 273, 259, 296, and 254 are formed.

The transistor 221 in FIG. 7 is a transistor which includes the oxide semiconductor layer 233 and in which the scan line 227 serves as a gate, the signal line 210 serves as one of a source electrode layer and a drain electrode layer, and the electrode layer 234 serves as the other of the source electrode layer and the drain electrode layer as illustrated in FIG. 8 and FIGS. 9A and 9B.

Further, as illustrated in FIG. 8 and FIG. 9A, the electrode layer 234 and the capacitor wiring 224 form the storage capacitor 222 in which the gate insulating layer 232 sandwiched between the electrode layer 234 and the capacitor wiring 224 serves as a dielectric.

The transistor 201 in FIG. 7 is a transistor which includes the oxide semiconductor layer 253 and in which the scan line 207 serves as a gate, the signal line 210 serves as one of a source electrode layer and a drain electrode layer, and the electrode layer 254 serves as the other of the source electrode layer and the drain electrode layer as illustrated in FIG. 8 and FIG. 9A.

Further, as illustrated in FIG. 8 and FIG. 9A, the electrode layer 254 and the capacitor wiring 214 form the storage capacitor 202 in which the gate insulating layer 232 sandwiched between the electrode layer 254 and the capacitor wiring 214 serves as a dielectric.

In FIG. 7, the transistor 217 which is one component of the photosensor 106 is a transistor which includes the oxide semiconductor layer 271 and in which the signal line 208 serves as a gate, the electrode layer 257 serves as one of a source electrode layer and a drain electrode layer, and the electrode layer 259 serves as the other of the source electrode layer and the drain electrode layer as illustrated in FIG. 8.

The transistor 218 is a transistor which includes the oxide semiconductor layer 295 and in which the reset line 215 serves as a gate, the electrode layer 259 serves as one of a source electrode layer and a drain electrode layer, and the electrode layer 296 serves as the other of the source electrode layer and the drain electrode layer as illustrated in FIG. 8.

The transistor 205 is a transistor which includes the oxide semiconductor layer 256 and in which the electrode layer 213 serves as a gate, the electrode layer 258 serves as one of a source electrode layer and a drain electrode layer, and the electrode layer 257 serves as the other of the source electrode layer and the drain electrode layer as illustrated in FIG. 8.

The transistor 206 is a transistor which includes the oxide semiconductor layer 255 and in which the selection line 209 serves as a gate, the electrode layer 257 serves as one of a source electrode layer and a drain electrode layer, and the photosensor output signal line 211 serves as the other of the source electrode layer and the drain electrode layer as illustrated in FIG. 8.

Next, second heat treatment (preferably at 200° C. to 400° C.) is performed in an inert gas atmosphere or an oxygen gas atmosphere. In this embodiment, the second heat treatment is performed at 220° C. for 1 hour in a nitrogen atmosphere. Through the second heat treatment, part of the oxide semiconductor layer (a channel formation region) is heated while being in contact with the insulating layer.

Then, an insulating layer 237 to be a protective insulating layer is formed, and an opening reaching the electrode layer 234, an opening reaching the electrode layer 273, and an opening reaching the power supply line 212 are formed. In this embodiment, a silicon oxide film with a thickness of 300 nm formed by a sputtering method is used as the insulating layer 237.

Next, a non-single-crystal semiconductor layer 240 is formed over the electrode layer 273. In this embodiment, as the non-single-crystal semiconductor layer 240, an i-type amorphous silicon layer with a thickness of 800 nm is formed by a plasma CVD method. Then, the non-single-crystal semiconductor layer 240 is selectively etched. FIG. 9A is a cross-sectional view up to this stage.

Next, a photosensitive organic resin layer is formed, a region to be an opening is exposed to light using a light-exposure mask, and a region to be uneven is exposed to light using another light-exposure mask and developed, whereby an insulating layer 241 which is partly uneven is formed. In this embodiment, an acrylic resin with a thickness of 1.5 μm is used for the photosensitive organic resin layer.

Then, a reflective conductive film is formed, and a reflective electrode layer 242 and a connection electrode layer 243 are formed using the reflective conductive film. Note that the reflective electrode layer 242 and the connection electrode layer 243 are illustrated in FIG. 9B. For the reflective conductive film, aluminum (Al), silver (Ag), or an alloy thereof such as aluminum containing neodymium (Nd) or an Ag—Pd—Cu alloy is used. In this embodiment, the reflective conductive film has a layered structure of a 100 nm-thick titanium (Ti) film and a 300 nm-thick aluminum (Al) film over the titanium (Ti) film. Next, third heat treatment is performed at 250° C. for 1 hour in a nitrogen atmosphere in this embodiment. Then, an alignment film 244 covering the reflective electrode layer 242 is formed.

Through the above steps, the pixel including the reflective electrode layer 242 and the light-receiving element 204 including the non-single-crystal semiconductor layer 240 can be manufactured over the same substrate. The light-receiving element 204 has a structure in which the non-single-crystal semiconductor layer 240 is sandwiched between the pair of electrodes, the electrode layer 273 and the connection electrode layer 243.

Then, a counter substrate to be bonded to the active matrix substrate manufactured in the above manner is prepared. A light-transmitting substrate 301 is used as the counter substrate. Over the substrate 301, a light-blocking layer (also referred to as black matrix) 302 and a color filter 303 are formed. Note that the color filter 303 is disposed so as to overlap with the reflective electrode layer 242. As the light-blocking layer 302, a metal film having low reflectance such as a titanium film or a chromium film, an organic resin film impregnated with a black pigment or a black dye, or the like can be used. The color filter 303 is a colored layer through which light in a specific wavelength range passes. For example, a red (R) coloring layer which transmits light in a red wavelength range, a green (G) coloring layer which transmits light in a green wavelength range, a blue (B) coloring layer which transmits light in a blue wavelength range, and the like can be used.

Neither a light-blocking layer nor a color filter is formed over the non-single-crystal semiconductor layer 240. Further, a light-transmitting conductive film 304 is formed so as to cover the substrate 301, the light-blocking layer 302, and the color filter 303. The light-transmitting conductive film 304 may be formed using indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, graphene, or the like. Further, a columnar spacer using an organic resin is formed. Lastly, an alignment film 306 is formed so as to cover them.

The counter substrate is attached to the active matrix substrate with a sealant, and a liquid crystal layer 305 is sandwiched between the pair of substrates. The light-blocking layer 302 of the counter substrate is provided so as not to overlap with a display region of the reflective electrode layer 242 or a sensing region of the light-receiving element 204. The columnar spacer provided on the counter substrate is positioned so as to overlap with electrode layers 251 and 252 illustrated in FIG. 8. Since the columnar spacer overlaps with the electrode layers 251 and 252, the pair of substrates is held at a certain distance. Note that the electrode layers 251 and 252 can be formed through the same steps as the electrode layer 234; thus, the electrode layers 251 and 252 can be formed without increasing the number of masks. The electrode layers 251 and 252 are not electrically connected anywhere and are in a floating state. In the case where the electrode layers 251 and 252 are formed through the same steps as the electrode layer 234, they are formed using the same material as the electrode layer 234.

Figure 11:
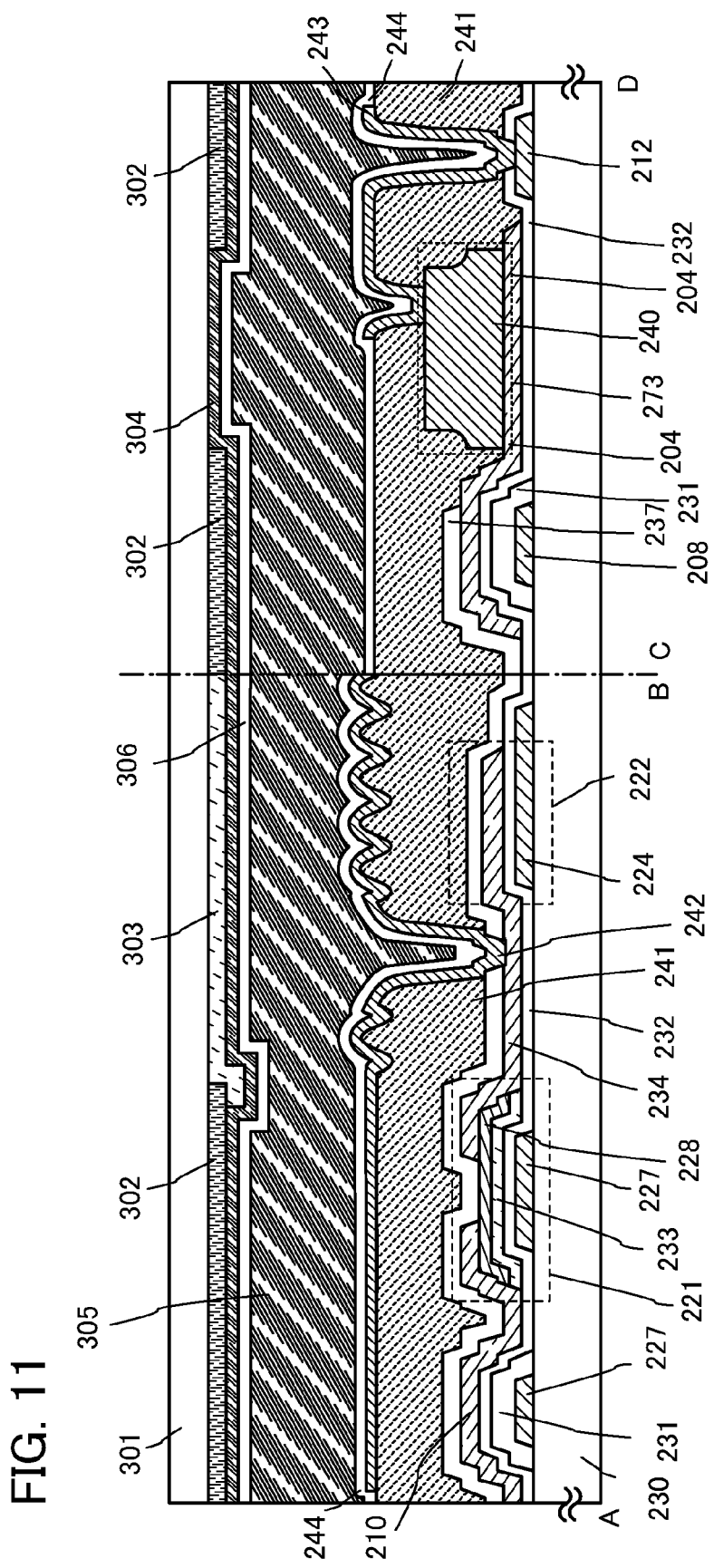
FIG. 11 is a cross-sectional view of a touch panel, illustrating one embodiment of the present invention.

A touch panel in which the reflective conductive film illustrated in FIG. 11 serves as a pixel electrode can be manufactured in the above manner.

In FIG. 11, the light-receiving element 204 has a structure in which the electrode layer 273, the non-single-crystal semiconductor layer 240, and the connection electrode layer 243 are sequentially stacked. That is, the pair of electrodes of the light-receiving element is over and below the non-single-crystal semiconductor layer, and in contact therewith. The structure of the light-receiving element of this embodiment is not limited to this, and the pair of electrodes of the light-receiving element may be formed in contact with the same surface of the non-single-crystal semiconductor layer. A touch panel having such a structure is illustrated in FIG. 12.

Figure 12:
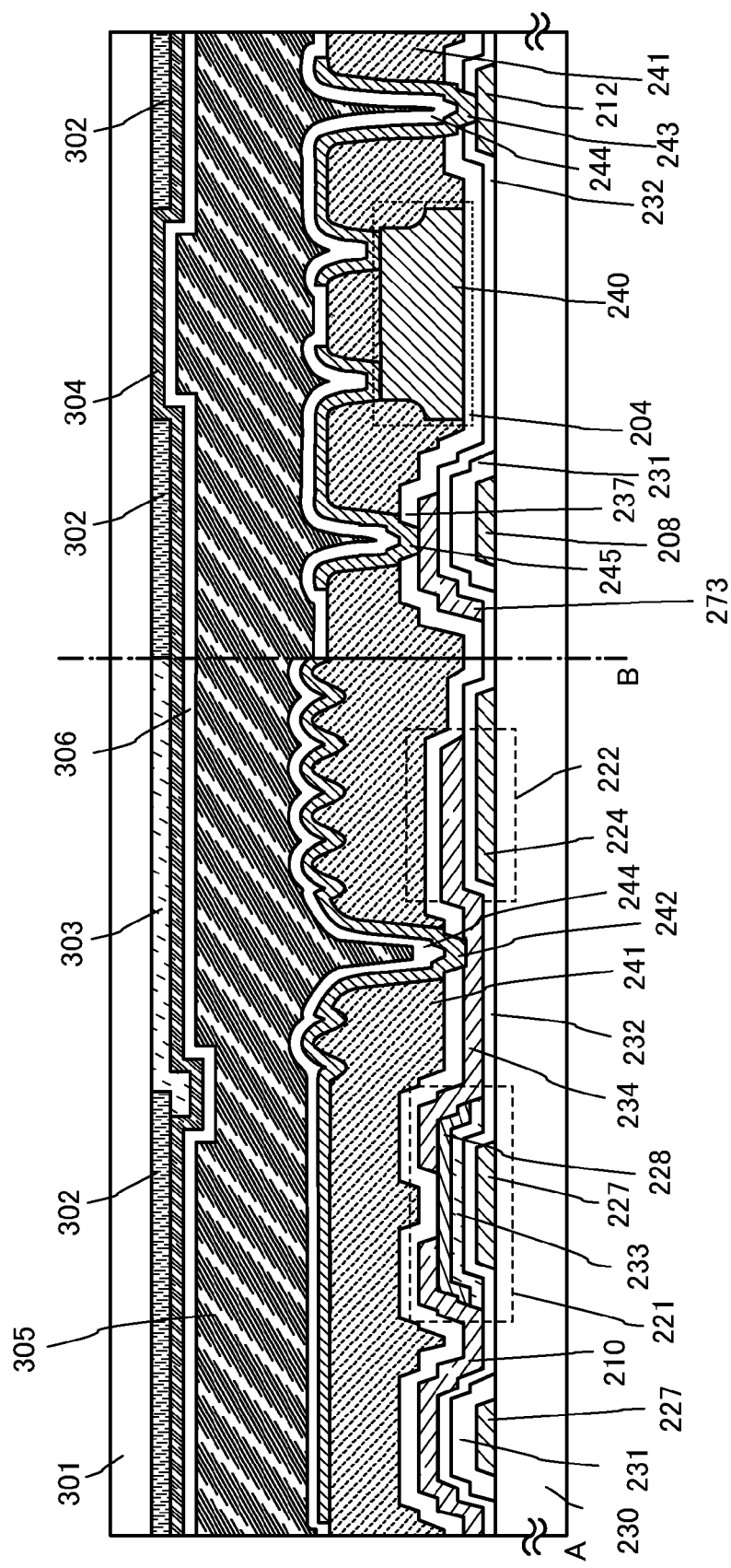
FIG. 12 is a cross-sectional view of a touch panel, illustrating one embodiment of the present invention.

In the light-receiving element 204 in FIG. 12, the connection electrode layer 243 and a connection electrode layer 245 formed through the same steps as the connection electrode layer 243 are provided in contact with the same surface of the non-single-crystal semiconductor layer 240. The connection electrode layer 245 is electrically connected to the electrode layer 273 through an opening provided in the insulating layer 237.

Figure 10:
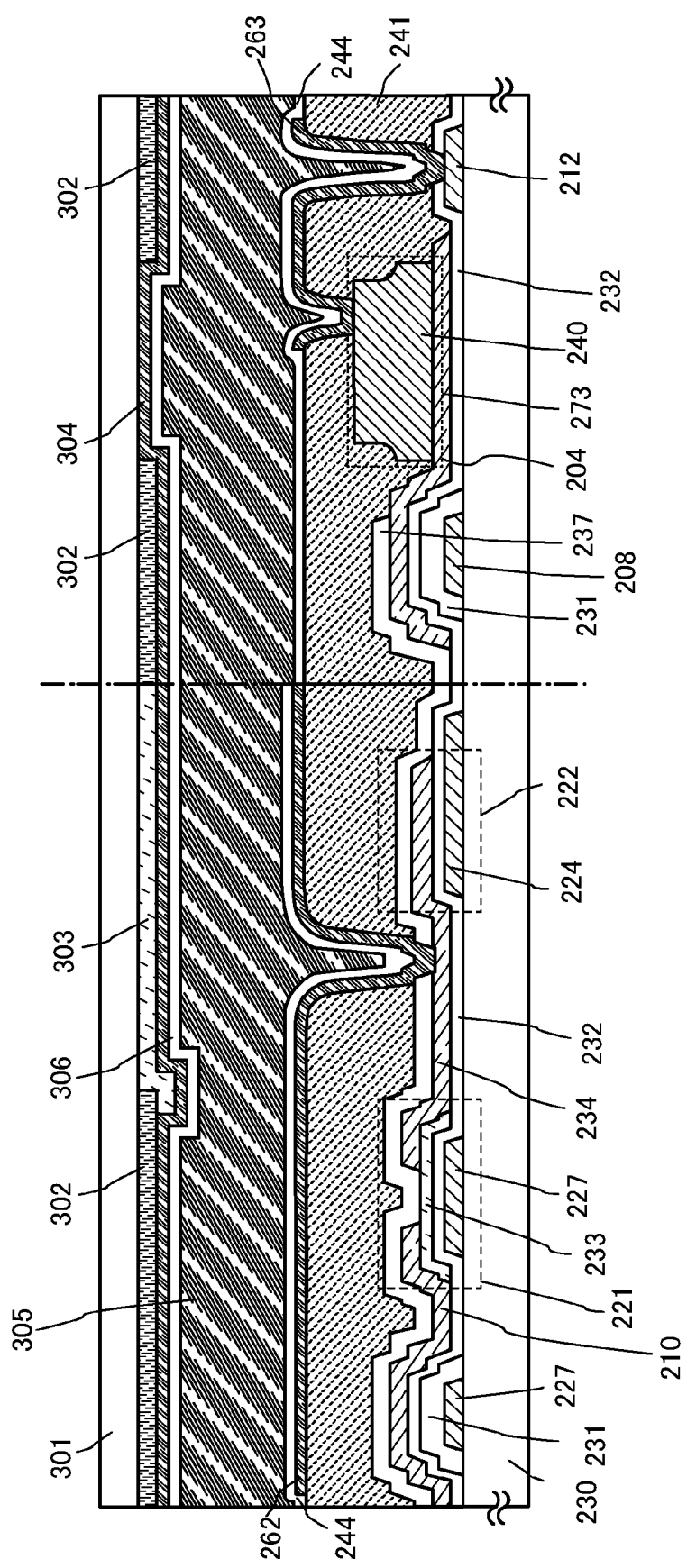
FIG. 10 is a cross-sectional view of a touch panel, illustrating one embodiment of the present invention.

FIG. 10 illustrates a cross section of a touch panel including a transmissive liquid crystal display region. The insulating layer 241 of the touch panel in FIG. 10 is formed so as to have a flat surface without unevenness.

In the touch panel illustrated in FIG. 10, an electrode layer 262 and a connection electrode layer 263 are formed using a light-transmitting conductive film instead of the reflective electrode layer 242 and the connection electrode layer 243 in FIG. 11. Light from a backlight provided on the active matrix substrate side is reflected by a finger or the like over the light-receiving element 204, and the reflected light enters the light-receiving element 204. In this manner, sensing using a photosensor can be performed.

A touch panel in which the light-transmitting conductive film serves as a pixel electrode can be manufactured in the above manner.

Note that the pair of electrodes between which the liquid crystal layer is sandwiched may be formed using a light-transmitting conductive film so as to be provided over the same substrate. With such a structure, a touch panel in which liquid crystal molecules are driven with a horizontal electric field mode such as an in-plane switching (IPS) mode can be manufactured.

This embodiment can be implemented in appropriate combination with any of the other embodiments.

Embodiment 4

In this embodiment, an example where EL elements are used as the display elements in Embodiments 1 and 2 will be described. Note that in this embodiment, portions which are the same as those in Embodiments 1 and 2 are denoted by the same reference numerals, and description thereof will not be repeated.

A circuit diagram of the pixel 103, the photosensor 106, and the pixel 104 will be described in this embodiment with reference to FIG. 13. The pixel 103 including an EL element 135 is electrically connected to the display element driver circuit 108 through the scan line (gate signal line) 207 and is electrically connected to the display element driver circuit 107 through the signal line (source signal line) 210.

The pixel 104 including an EL element 136 is electrically connected to the display element driver circuit 108 through the scan line (gate signal line) 227 and is electrically connected to the display element driver circuit 107 through the signal line (source signal line) 210. The emission colors of the EL element 136 and the EL element 135 are white, and the EL element 136 and the EL element 135 are connected to a common power supply line 238. Light from the EL element 136 passes through a coloring layer (a red coloring layer, a blue coloring layer, or a green coloring layer) overlapping with the EL element 136 so that any one of red, blue, and green is recognized by human eyes.

Figure 13:
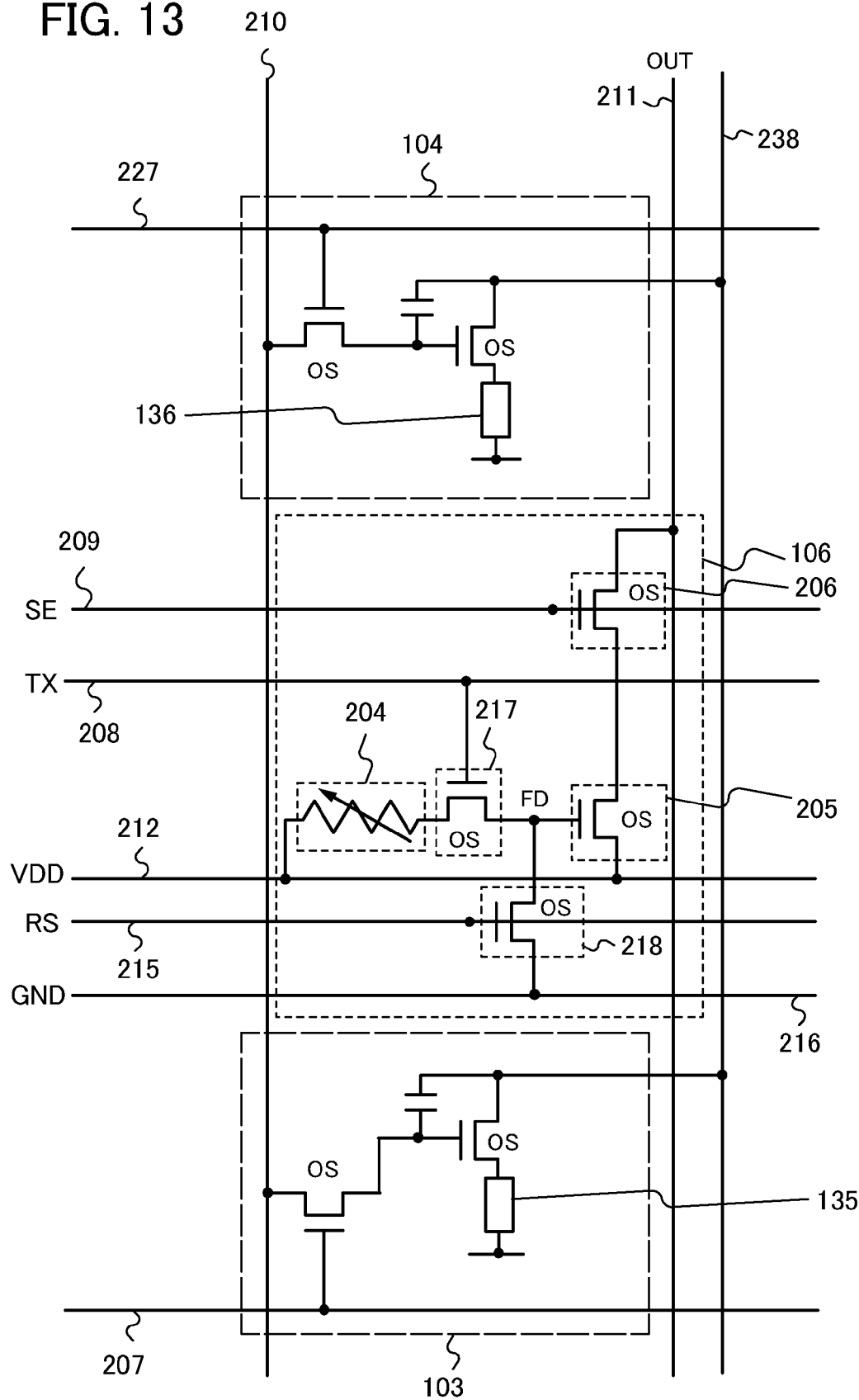
FIG. 13 is an equivalent circuit diagram of pixels, illustrating one embodiment of the present invention.
Figure 14:
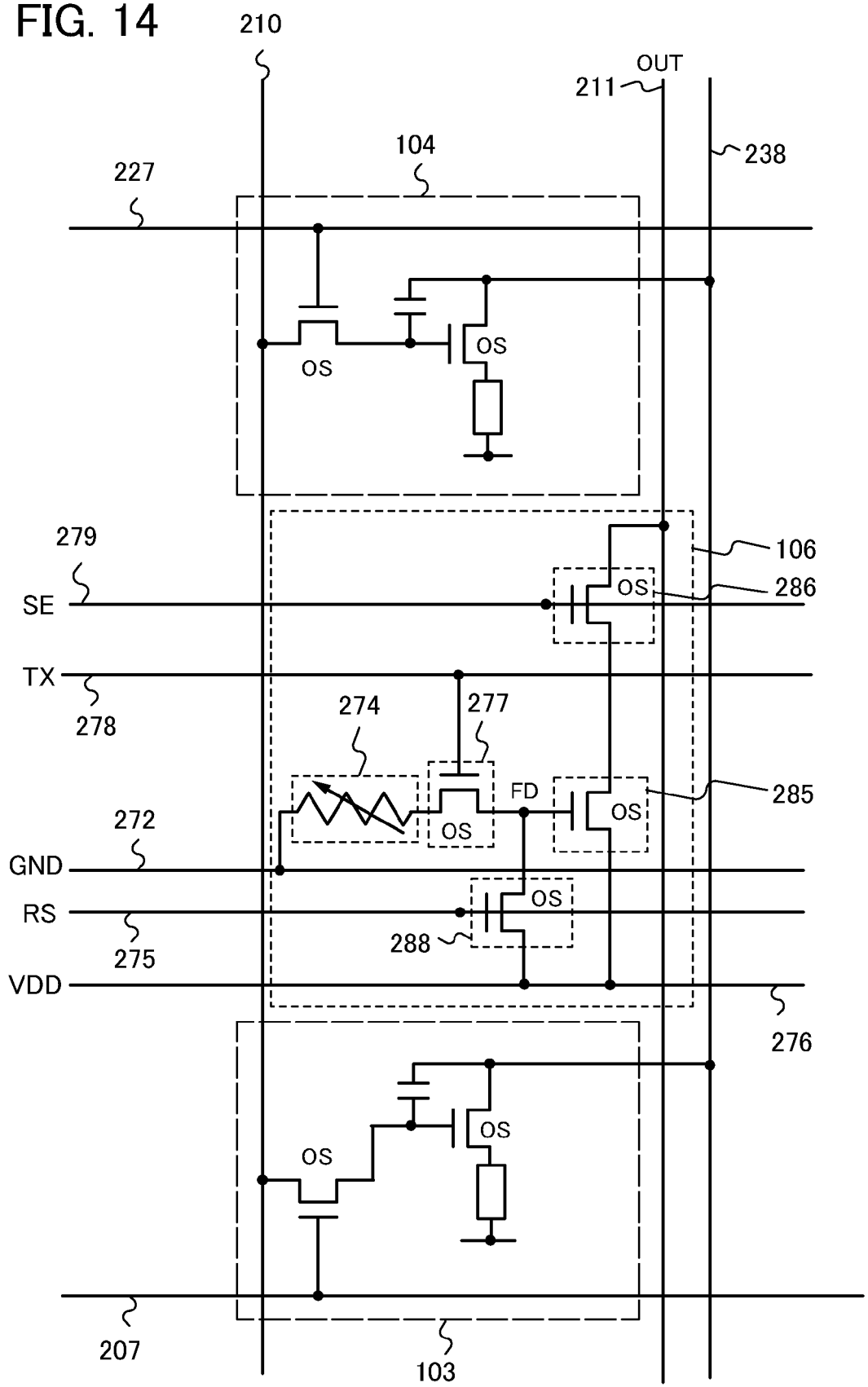
FIG. 14 is an equivalent circuit diagram of pixels, illustrating one embodiment of the present invention.

FIG. 14 illustrates the structure of a photosensor which is different from the structure in FIG. 13.

Note that the structure in FIG. 14 is the same as that in FIG. 13 except that the display element 125 is different from that in FIG. 5; thus, the detailed description is omitted here.

Figure 15:
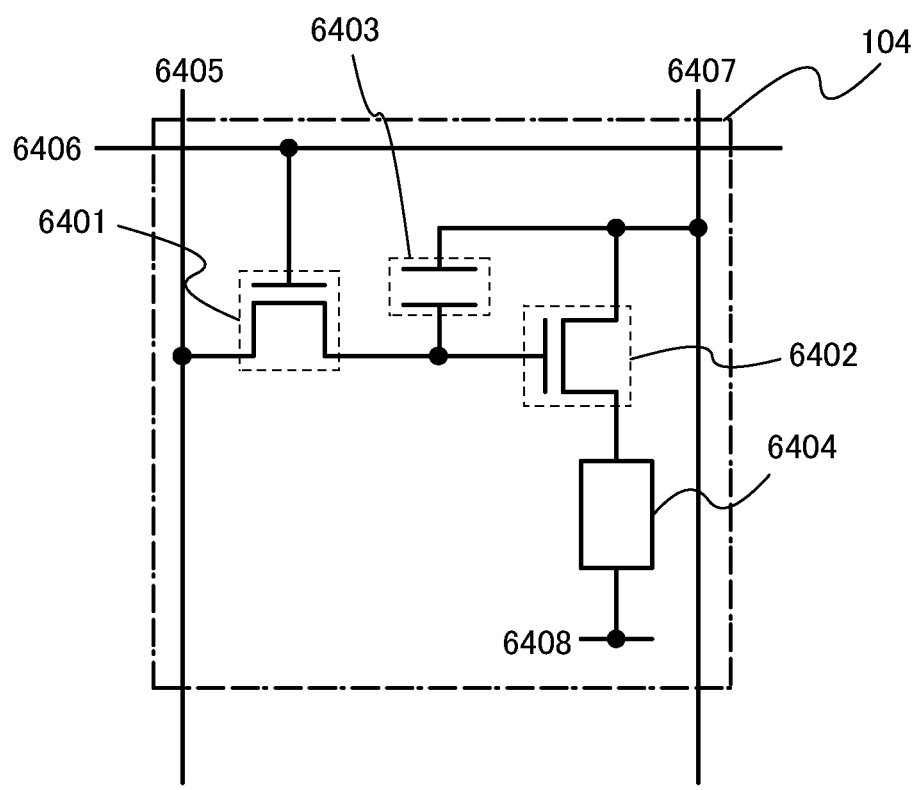
FIG. 15 is an equivalent circuit diagram of a pixel, illustrating one embodiment of the present invention.

FIG. 15 illustrates an example of the structure of the pixel 104 in FIG. 13.

A structure and operation of a pixel to which digital time grayscale driving can be applied are described. Here, one pixel 104 includes two n-channel transistors each of which includes an oxide semiconductor layer as a channel formation region.

The pixel 104 includes a switching transistor 6401, a driving transistor 6402, a light-emitting element 6404, and a capacitor 6403. A gate of the switching transistor 6401 is connected to a scan line 6406, a first electrode (one of a source electrode layer and a drain electrode layer) thereof is connected to a signal line 6405, and a second electrode (the other of the source electrode layer and the drain electrode layer) thereof is connected to a gate of the driving transistor 6402. The gate of the driving transistor 6402 is connected to a power supply line 6407 through the capacitor 6403, a first electrode thereof is connected to the power supply line 6407, and a second electrode thereof is connected to a first electrode (a pixel electrode layer) of the light-emitting element 6404. A second electrode of the light-emitting element 6404 corresponds to a common electrode 6408. The common electrode 6408 is electrically connected to a common potential line provided over the same substrate as the common electrode 6408.

The second electrode (common electrode 6408) of the light-emitting element 6404 is set to a low power supply potential. Note that the low power supply potential is lower than a high power supply potential that is supplied to the power supply line 6407. For example, GND or 0 V may be set as the low power supply potential. The difference between the high power supply potential and the low power supply potential is applied to the light-emitting element 6404 so that current flows through the light-emitting element 6404, whereby the light-emitting element 6404 emits light. Thus, each potential is set such that the difference between the high power supply potential and the low power supply potential is greater than or equal to the forward threshold voltage of the light-emitting element 6404.

Note that a gate capacitor of the driver transistor 6402 may be used as a substitute for the capacitor 6403, so that the capacitor 6403 can be omitted. The gate capacitor of the driver transistor 6402 may be formed between a channel region and a gate electrode.

In the case of using a voltage-input voltage driving method, a video signal is input to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as in FIG. 15 can be employed by inputting signals in a different way.

In the case of performing analog grayscale driving, a voltage higher than or equal to the following is applied to the gate of the driving transistor 6402: forward voltage of the light-emitting element 6404+$V_{th}$ of the driving transistor 6402. The forward voltage of the light-emitting element 6404 refers to a voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than the gate potential of the driving transistor 6402. When an analog video signal is used, it is possible to feed current to the light-emitting element 6404 in accordance with the video signal and perform analog grayscale driving.

Note that the structure of the pixel 104 is not limited to that illustrated in FIG. 15. For example, the pixel illustrated in FIG. 15 may further include a switch, a resistor, a capacitor, a transistor, a logic circuit, or the like.

Embodiment 5

In this embodiment, the process of forming an EL element, a transistor including an oxide semiconductor for driving the EL element, a transistor including an oxide semiconductor for driving a sensor element, and the sensor element including amorphous silicon over the same substrate will be described with reference to FIG. 16.

First, a first buffer layer 704 is formed over a first substrate 700. The first buffer layer 704 is preferably formed with a single-layer structure or a layered structure using any of silicon nitride, silicon oxynitride, silicon nitride oxide, and the like. The first buffer layer 704 is not necessarily provided when not needed.

Next, a conductive film is formed over the first buffer layer 704, and a photolithography step and an etching step are performed, so that gate electrode layers 706a and 706b are formed.

The gate electrode layers 706a and 706b can be formed with a single-layer structure or a layered structure using any of metal materials such as molybdenum, titanium, chromium, tantalum, tungsten, aluminum, copper, neodymium, and scandium, or an alloy material which contains any of these elements.

Then, a gate insulating layer 708 is formed over the gate electrode layers 706a and 706b. The gate insulating layer 708 can be formed with a single-layer structure or a layered structure using any of silicon oxide, silicon nitride, silicon oxynitride, silicon nitride oxide, and aluminum oxide by a plasma CVD method, a sputtering method, or the like. Alternatively, the gate insulating layer 708 can be formed using gallium oxide, an insulating In—Ga—Zn—O-based metal oxide, or the like by a sputtering method. An insulating In—Ga—Zn-based oxide film may be formed under the following conditions: an oxide target having a composition of In:Ga:Zn=1:3:2 [atomic ratio] is used, the substrate temperature is room temperature, and argon or a mixed gas of argon and oxygen is used as a sputtering gas.

Next, a semiconductor layer is formed, and a photolithography step and an etching step are performed thereon, so that island-shaped semiconductor layers 710a and 710b are formed.

The semiconductor layers 710a and 710b are formed using an oxide semiconductor material. As the oxide semiconductor material, an In—Ga—Zn—O-based metal oxide or the like can be used as appropriate. In this embodiment, the semiconductor layers 710a and 710b have a layered structure of a semiconductor film containing more In than Ga and Zn in an atomic ratio and an oxide semiconductor layer having a composition different from that of the semiconductor film over the semiconductor film. For example, a layered structure in which an In—Ga—Zn-based oxide film formed using a target with a composition of In:Ga:Zn=3:1:2 in an atomic ratio is a first layer and an In—Ga—Zn-based oxide film formed using a target with a composition of In:Ga:Zn=1:1:1 in an atomic ratio is a second layer is used. In order to reduce leakage current in an off state of a light-emitting element to be formed later, the semiconductor layers 710a and 710b are preferably semiconductor layers which are formed using an In—Ga—Zn—O-based metal oxide that is an oxide semiconductor material and have a small off-state current.

Next, a conductive film is formed over the gate insulating layer 708 and the semiconductor layers 710a and 710b, and a photolithography step and an etching step are performed thereon, so that a source electrode layer 712a, a drain electrode layer 712b, an electrode 712c, and an electrode 712d are formed.

As the conductive film for the source electrode layer 712a, the drain electrode layer 712b, the electrode 712c, and the electrode 712d, for example, a metal film containing an element selected from Al, Cr, Cu, Ta, Ti, Mo, and W, a metal nitride film containing any of these elements (a titanium nitride film, a molybdenum nitride film, or a tungsten nitride film), or the like can be used.

Then, an amorphous semiconductor film, here, an amorphous silicon layer obtained by a PCVD method is formed over the electrode 712c, and a photolithography step and an etching step are performed, so that an i layer 751 is formed. In this embodiment, a 700 nm-thick amorphous silicon layer is formed under the following deposition conditions: the flow rate of silane is 150 sccm, the flow rate of hydrogen is 500 sccm, the pressure is 80 Pa, the power is 200 W, the distance between electrodes is 20 mm, and the deposition rate is 18.8 nm/min.

In this embodiment, the i layer 751 is formed after the source electrode layer 712a, the drain electrode layer 712b, the electrode 712c, and the electrode 712d are formed; however, there is no particular limitation on the order of forming them. For example, the source electrode layer 712a, the drain electrode layer 712b, the electrode 712c, and the electrode 712d may be formed in such a manner that the i layer 751 is formed over a conductive film and the conductive film is subjected to a photolithography step and an etching step. In this case, when an amorphous silicon layer is formed over and in contact with the oxide semiconductor layer and then is selectively removed, a reduction in the thickness of the oxide semiconductor layer can be prevented.

A first insulating layer 714 is formed over the semiconductor layers 710a and 710b, the source electrode layer 712a, the drain electrode layer 712b, the electrodes 712c and 712d, and the i layer 751. As the first insulating layer 714, an inorganic insulating film such as a silicon oxide film, a silicon oxynitride film, or an aluminum oxide film can be used.

Then, a second insulating layer 716 is formed over the first insulating layer 714.

As the second insulating layer 716, an insulating film having a planarization function is preferably selected in order to reduce surface unevenness due to the transistor. For example, an organic material such as a polyimide resin, an acrylic resin, or a benzocyclobutene-based resin can be used.

Besides the above organic materials, a low-dielectric constant material (a low-k material) or the like can be used.

Then, a photolithography step and an etching step are performed, whereby an opening reaching the drain electrode layer 712b and an opening reaching the i layer 751 are formed in the first insulating layer 714 and the second insulating layer 716. As a method for forming the openings, a dry etching method, a wet etching method, or the like may be selected as appropriate.

Then, a conductive film is formed over the second insulating layer 716 and the drain electrode layer 712b, and a photolithography step and an etching step are performed thereon, whereby a connection electrode 715 and an electrode 752 are formed. Through the above steps, a transistor 750 and a transistor 753 can be manufactured. The transistor 750 and the transistor 753 are n-channel transistors.

An example of a method for manufacturing a light-emitting element 730 connected to the transistor 750 will be described below.

A third insulating layer 717 is formed over the second insulating layer 716. The third insulating layer 717 can be formed using the same material as the second insulating layer 716; it is suitable to use an insulating film with a planarization function for the third insulating layer 717 in order to reduce surface unevenness due to the transistor.

Then, a photolithography step and an etching step are performed, whereby an opening reaching the connection electrode 715 is formed in the third insulating layer 717.

Then, a conductive film is formed over the third insulating layer 717 and the connection electrode 715, and a photolithography step and an etching step are performed, so that a first electrode 718 is formed.

For the first electrode 718, a material which efficiently reflects light from a light-emitting layer 720 (formed later) serving as a light-emitting layer and containing an organic compound is preferably used. This is in order to improve light-extraction efficiency. Note that the first electrode 718 may have a layered structure. For example, a conductive film of a metal oxide, a titanium film, or the like can be formed thin on the side which is in contact with the light-emitting layer 720 containing an organic compound, and a metal film (aluminum, an alloy containing aluminum, silver, or the like) which has high reflectance can be formed on the other side. Such a structure is preferable because formation of an insulating film between the light-emitting layer 720 containing an organic compound and the metal film (aluminum, an alloy containing aluminum, silver, or the like) which has high reflectance can be suppressed. In this embodiment, the first electrode 718 has a three-layer structure in which a 200 nm-thick aluminum film is formed over a 50 nm-thick titanium film, and an 8 nm-thick titanium film is formed thereover.

Next, a first partition 724 is formed over the first electrode 718.

The first partition 724 is formed using an organic insulating material or an inorganic insulating material. It is particularly preferable that the first partition 724 be formed using a photosensitive resin material and a sidewall of the first partition 724 be formed to have an inclined surface with continuous curvature.

Then, a second partition 726 is formed over the first partition 724. The shape of the second partition 726 is important because the second partition 726 needs to separate the light-emitting layer containing an organic compound to be formed later. The shape of a cross section of the second partition 726 is such that the angle between a side surface of the second partition 726 and a plane of the first substrate 700 is greater than or equal to 90° and less than or equal to 135°. For example, the second partition 726 of this embodiment has an inverse tapered shape. The inverse tapered shape used herein refers to a shape in which the side portion or the upper portion thereof is on the outer side than the bottom portion in the direction parallel to the substrate.

The second partition 726 can be formed using an inorganic insulating material or an organic insulating material. As the organic insulating material, for example, a negative or positive photosensitive resin material, a non-photosensitive resin material, or the like can be used.

Next, the light-emitting layer containing an organic compound is formed over the first electrode 718, the first partition 724, and the second partition 726. The light-emitting layer containing an organic compound can be formed by an evaporation method (including a vacuum evaporation method) or the like.

The light-emitting layer containing an organic compound is separated by the second partition 726. Only the light-emitting layer 720 containing an organic compound over the first electrode 718 functions as a light-emitting layer of the light-emitting element 730.

The light-emitting layer 720 containing an organic compound over the first electrode 718 may have a single-layer structure or a layered structure of a plurality of layers. Light emitted from the light-emitting layer 720 containing an organic compound is preferably white, and preferably has a peak in each of red, green, and blue wavelength ranges.

Then, a second electrode 722 is formed over the light-emitting layer containing an organic compound.

For the second electrode 722, a metal film with a thickness less than or equal to 20 nm, preferably greater than or equal to 15 nm and less than or equal to 20 nm is used. Typically, a MgAg film is used. Alternatively, the second electrode may be formed in such a manner that indium tin oxide (ITO), indium zinc oxide, or the like is stacked over a MgAg film.

Note that one of the first electrode 718 and the second electrode 722 functions as an anode of the light-emitting element, and the other functions as a cathode of the light-emitting element. It is preferable to use a substance having a high work function for the electrode which functions as an anode, and a substance having a low work function for the electrode which functions as a cathode.

Through the above steps, the transistor 750 controlling driving of the light-emitting element, the transistor 753 controlling driving of the sensor element, the sensor element, and the light-emitting element 730 can be formed over the same substrate.

Then, a method for manufacturing a second substrate 760 over which a light-blocking film 764, a coloring layer 766 functioning as a color filter, and an overcoat 768 are formed will be described below.

A second buffer layer 762 is formed over the second substrate 760. The second buffer layer 762 can be formed using a material and a method similar to those of the first buffer layer 704 described above.

Then, a material film is formed over the second buffer layer 762, and a photolithography step and an etching step are performed, so that the light-blocking film 764 serving as a black matrix is formed. As the light-blocking film 764, a metal film having low reflectance, such as titanium or chromium, an organic resin film which is impregnated with a black pigment or a black dye, or the like can be used.

Next, a plurality of kinds of coloring layers 766 functioning as color filters is formed over the second buffer layer 762 and the light-blocking film 764. The coloring layers 766 are each a colored layer which transmits light in a specific wavelength range. For example, a red (R) coloring layer which transmits light in a red wavelength range, a green (G) coloring layer which transmits light in a green wavelength range, a blue (B) coloring layer which transmits light in a blue wavelength range, and the like can be used. Each coloring layer is formed in a desired position with a known material by a printing method, an inkjet method, an etching method using a photolithography technique, or the like.

Although a method using three colors of R, G, and B is described in this embodiment, a structure in which four colors of R, G, B, and Y (yellow) are used, or a structure in which five or more colors are used may alternatively be employed in one embodiment of the present invention.

Next, the overcoat 768 is formed over the light-blocking film 764 and the coloring layers 766.

The overcoat 768 can be formed using an organic resin film of acrylic, polyimide, or the like. With the overcoat 768, diffusion of an impurity component or the like contained in the coloring layers 766 to the light-emitting element side can be prevented. The overcoat 768 may have a layered structure of an organic resin film and an inorganic insulating film. Silicon nitride, silicon oxide, or the like can be used for the inorganic insulating film. Note that the overcoat 768 is not necessarily provided.

Through the above steps, the second substrate 760 over which the second buffer layer 762, the light-blocking film 764, the coloring layer 766, and the overcoat 768 are provided is formed.

Next, the first substrate 700 and the second substrate 760 are aligned and bonded to each other using a first adhesive layer 770.

There is no particular limitation on the first adhesive layer 770, and a light-transmitting adhesive having high refractive index and capable of bonding the first substrate 700 and the second substrate 760 to each other can be used. A substance having a molecular size less than or equal to the wavelength of light and functioning as a dry agent (zeolite or the like), or a filler with high refractive index (titanium oxide, zirconium, or the like) is preferably mixed to the adhesive because reliability and light-extraction efficiency of the light-emitting element 730 are improved.

Further, a sealing film with low moisture permeability may be formed between the first adhesive layer 770 and the second electrode 722. As the sealing film with low moisture permeability, for example, silicon oxide, silicon nitride, aluminum oxide, or the like can be used.

Through the above steps, an active matrix EL display device having a touch-input function can be manufactured.

Figure 16:
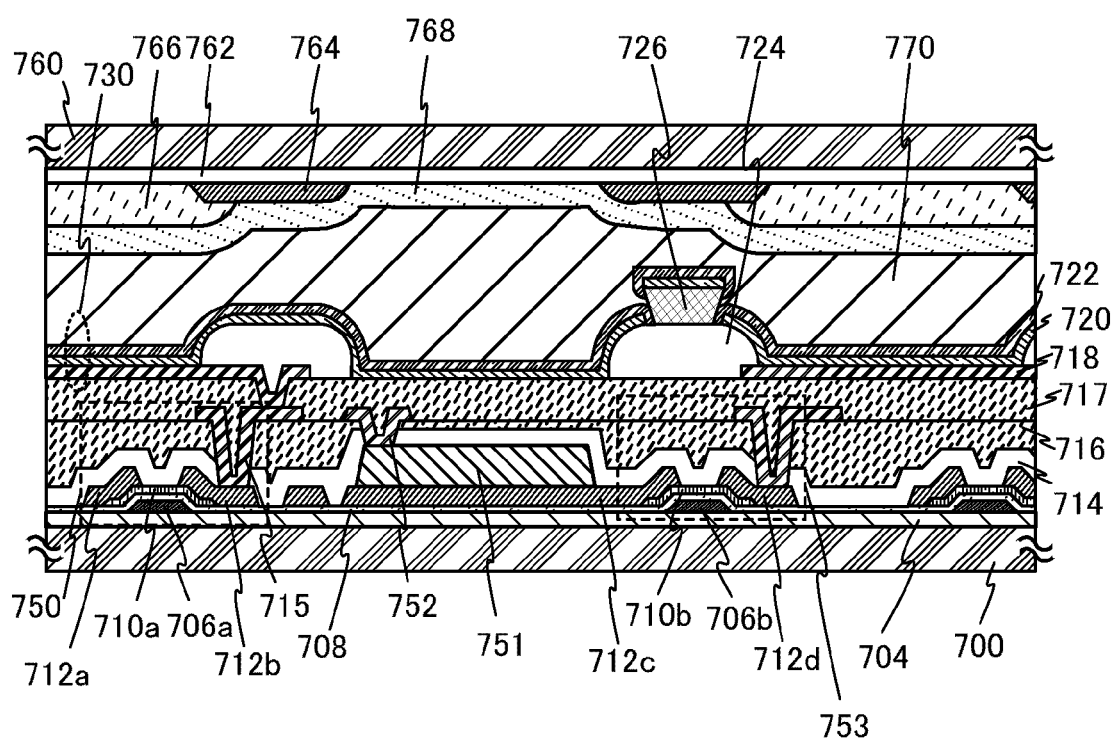
FIG. 16 is a cross-sectional view of a semiconductor device, illustrating one embodiment of the present invention.

The display device illustrated in FIG. 16 includes the first buffer layer 704 which is provided over the first substrate 700, the transistor 750 which is provided over the first buffer layer 704 and controls driving of the light-emitting element, the light-emitting element 730 which is electrically connected to the transistor 750, the first partition 724 which surrounds a light-emitting region of the light-emitting element 730, and the second partition 726 which is formed over the first partition 724. Further, the display device illustrated in FIG. 16 includes, over the first buffer layer 704, the transistor 753 which is formed through the same steps as the transistor 750 and controls driving of the sensor element, and the sensor element which is electrically connected to the transistor 753.

In the display device illustrated in FIG. 16, the light-blocking film 764 and the coloring layers 766 are formed on the second substrate 760, and the second substrate 760 and the first substrate 700 are bonded to each other with the first adhesive layer 770 and a second adhesive layer. Although not illustrated, the second adhesive layer surrounds a pixel portion and the top surface of the second adhesive layer has a closed-loop shape in contact with a side surface of the first adhesive layer.

The transistor 750 includes the gate electrode layer 706a formed over the first buffer layer 704, the gate insulating layer 708 formed over the gate electrode layer 706a, the semiconductor layer 710a formed over the gate insulating layer 708, and the source electrode layer 712a and the drain electrode layer 712b formed over the semiconductor layer 710a. The transistor 750 is covered with the first insulating layer 714, the second insulating layer 716, and the third insulating layer 717. In the transistor 750, the connection electrode 715 is formed so as to be electrically connected to the drain electrode layer 712b through the opening formed in the first insulating layer 714 and the second insulating layer 716, and the connection electrode 715 is electrically connected to the first electrode 718 over the third insulating layer 717 through the opening formed in the third insulating layer 717. The first electrode 718, the light-emitting layer 720 containing an organic compound over the first electrode 718, and the second electrode 722 over the light-emitting layer 720 containing an organic compound are provided over the third insulating layer 717.

The transistor 753 includes the gate electrode layer 706b formed over the first buffer layer 704, the gate insulating layer 708 formed over the gate electrode layer 706b, the semiconductor layer 710b formed over the gate insulating layer 708, and the electrode 712c and the electrode 712d functioning as a source electrode layer and a drain electrode layer over the semiconductor layer 710b.

Over the electrode 712c, the i layer 751 is formed, and the electrode 752 is formed so as to be electrically connected to the i layer 751 through the opening formed in the first insulating layer 714 and the second insulating layer 716. The electrode 752 is formed through the same steps as the connection electrode 715. Therefore, the electrode 752 is formed using the same material as the connection electrode 715.

The display device illustrated in FIG. 16 is a top-emission display device in which light from the light-emitting element 730 is emitted to the second substrate 760 side through the coloring layer 766. For such a reason, as the second substrate 760, a light-transmitting substrate such as a glass substrate or a plastic substrate is used.

The transistor 753 illustrated in FIG. 16 has a structure similar to that of the transistor 750. However, the size (e.g., channel length or channel width) of each transistor and a connection and the like of the transistors can be adjusted by a practitioner as appropriate.

This embodiment can be freely combined with Embodiment 1 or Embodiment 4.

Embodiment 6

In this embodiment, a semiconductor device including an EL element, a transistor including an oxide semiconductor for driving the EL element, a transistor including an oxide semiconductor for driving a sensor element, and the sensor element including amorphous silicon over the same substrate will be described with reference to FIG. 17.

Figure 17:
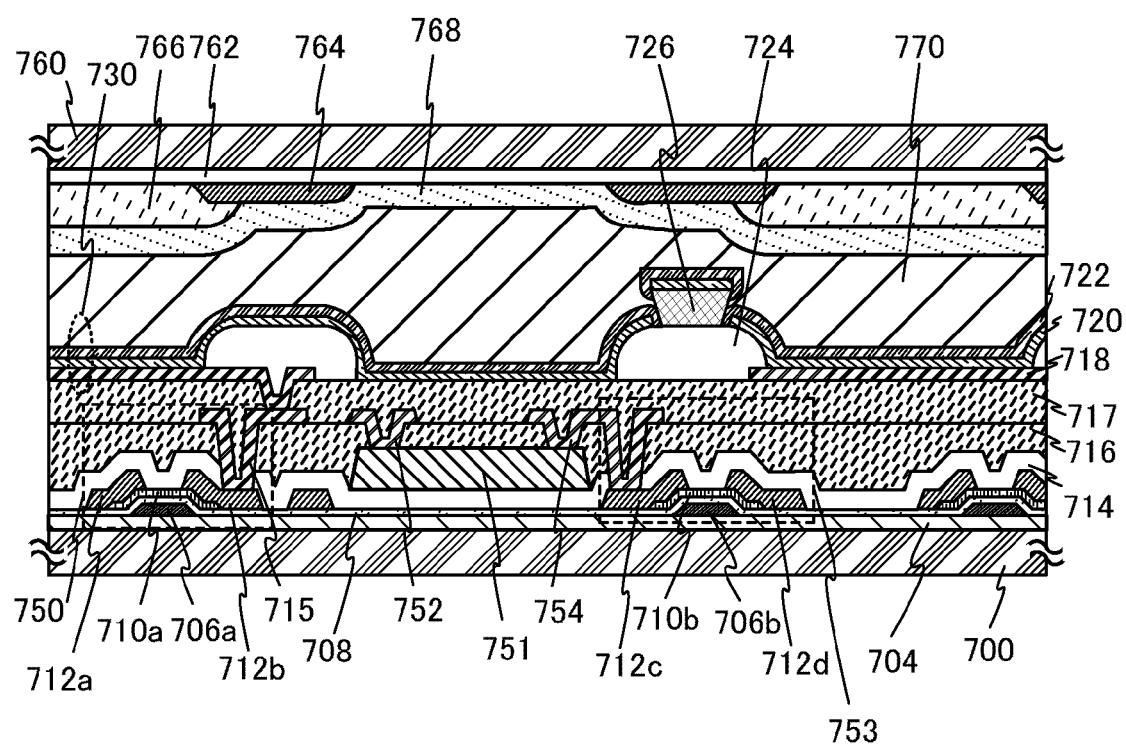
FIG. 17 is a cross-sectional view of a semiconductor device, illustrating one embodiment of the present invention.

FIG. 17 is different from FIG. 16 only in a peripheral structure of a sensor element; thus, descriptions of the same portions are omitted here.

Although an example where a pair of electrodes is disposed over and below the i layer 751 is described in Embodiment 5, an example where a pair of electrodes is disposed over the i layer is described in this embodiment.

Some steps for obtaining a cross-sectional structure illustrated in FIG. 17 will be described below.

As in Embodiment 5, a conductive film is formed over the gate insulating layer 708 and the semiconductor layers 710a and 710b, and a photolithography step and an etching step are performed, so that the source electrode layer 712a, the drain electrode layer 712b, the electrode 712c, and the electrode 712d are formed. Then, the first insulating layer 714 covering them is formed. Next, an amorphous semiconductor film, here, an amorphous silicon layer obtained by a PCVD method is formed over the first insulating layer 714, and a photolithography step and an etching step are performed, so that the i layer 751 is formed. Then, the second insulating layer 716 is formed so as to cover the i layer 751, and a plurality of openings reaching the i layer 751 is formed in the second insulating layer 716. After that, a conductive film is formed, and a photolithography step and an etching step are performed, whereby the electrode 752 over and in contact with the i layer 751 and an electrode 754 over and in contact with the i layer 751 are formed. The electrode 754 is also electrically connected to the electrode 712c of the transistor 753. In this manner, the semiconductor device including the sensor element in which the electrodes 752 and 754 are provided over the i layer 751 can be manufactured.

The number of steps and the number of masks for obtaining the cross-sectional structure illustrated in FIG. 16 are the same as those for obtaining the cross-sectional structure illustrated in FIG. 17. Note that the number of openings in the cross-sectional structure illustrated in FIG. 17 is larger than that illustrated in FIG. 16.

This embodiment can be freely combined with Embodiment 1, Embodiment 4, or Embodiment 5.

This application is based on Japanese Patent Application serial no. 2012-112752 filed with Japan Patent Office on May 16, 2012, and Japanese Patent Application serial no. 2012-112861 filed with Japan Patent Office on May 16, 2012, the entire contents of which are hereby incorporated by reference.

What is claimed is:

1. A semiconductor device comprising:
a display portion including a plurality of pixels;
a photosensor adjacent to at least one of the plurality of pixels;
an arithmetic circuit; and
a gradient detector,
wherein a function relating to display and input on the display portion is switched by the arithmetic circuit in response to a signal from the gradient detector,
wherein the photosensor comprises:
  a light-receiving element comprising a non-single-crystal semiconductor layer between a pair of electrodes;
  a ground line electrically connected to one of the pair of electrodes;
  a first transistor, a gate of which is electrically connected to a signal line, one of a source and a drain of which is electrically connected to the other of the pair of electrodes, and a channel formation region of which is in a first oxide semiconductor layer;
  a second transistor, a gate of which is electrically connected to a reset line, one of a source and a drain of which is electrically connected to the other of the source and the drain of the first transistor, the other of the source and the drain of which is electrically connected to a power supply line, and a channel formation region of which is in a second oxide semiconductor layer;
  a third transistor, a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and
  a fourth transistor, a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer.

2. The semiconductor device according to claim 1, wherein the gradient detector is a gyroscope or a triaxial acceleration sensor.

3. The semiconductor device according to claim 1, wherein the first transistor includes an oxide semiconductor film containing indium, gallium, and zinc.

4. The semiconductor device according to claim 3, wherein the oxide semiconductor film is a crystalline oxide semiconductor.

5. The semiconductor device according to claim 3, wherein the oxide semiconductor film is a microcrystalline oxide semiconductor.

6. The semiconductor device according to claim 1, wherein the photosensor includes an amorphous semiconductor layer.

7. A semiconductor device comprising:
a display portion including a plurality of pixels;
a photosensor adjacent to at least one of the plurality of pixels;
an arithmetic circuit;
a gradient detector, and
wherein the number of the photosensors is smaller than that of the pixels,
wherein the photosensor comprises:
  a light-receiving element comprising a non-single-crystal semiconductor layer between a pair of electrodes;
  a ground line electrically connected to one of the pair of electrodes;
  a first transistor, a gate of which is electrically connected to a signal line, one of a source and a drain of which is electrically connected to the other of the pair of electrodes, and a channel formation region of which is in a first oxide semiconductor layer;
  a second transistor, a gate of which is electrically connected to a reset line, one of a source and a drain of which is electrically connected to the other of the source and the drain of the first transistor, the other of the source and the drain of which is electrically connected to a power supply line, and a channel formation region of which is in a second oxide semiconductor layer;
  a third transistor, a gate of which is electrically connected to the other of the source and the drain of the first transistor and the one of the source and the drain of the second transistor, one of a source and a drain of which is electrically connected to the power supply line, and a channel formation region of which is in a third oxide semiconductor layer; and a fourth transistor, a gate of which is electrically connected to a selection line, one of a source and a drain of which is electrically connected to the other of the source and the drain of the third transistor, the other of the source and the drain of which is electrically connected to a photosensor output signal line, and a channel formation region of which is in a fourth oxide semiconductor layer, and wherein the first transistor includes an oxide semiconductor film containing indium, gallium, and zinc.

8. The semiconductor device according to claim 7, wherein a function relating to display and input on the display portion is switched by the arithmetic circuit in response to a signal from the gradient detector.

9. The semiconductor device according to claim 7, wherein the gradient detector is a gyroscope or a triaxial acceleration sensor.

10. The semiconductor device according to claim 7, wherein the oxide semiconductor film is a crystalline oxide semiconductor.

11. The semiconductor device according to claim 7, wherein the oxide semiconductor film is a microcrystalline oxide semiconductor.

12. The semiconductor device according to claim 7, wherein the photosensor includes an amorphous semiconductor layer.

* * * * *